(12) United States Patent
Murakami

(10) Patent No.: US 11,832,388 B2
(45) Date of Patent: Nov. 28, 2023

(54) WIRING BOARD

(71) Applicant: SHINKO ELECTRIC INDUSTRIES CO., LTD., Nagano (JP)

(72) Inventor: Masahiro Murakami, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 8 days.

(21) Appl. No.: 17/659,352

(22) Filed: Apr. 15, 2022

(65) Prior Publication Data

US 2022/0353990 A1    Nov. 3, 2022

(30) Foreign Application Priority Data

Apr. 28, 2021  (JP) ................... 2021-076129

(51) Int. Cl.
 *H05K 1/11*  (2006.01)
(52) U.S. Cl.
 CPC ....... *H05K 1/115* (2013.01); *H05K 2201/096* (2013.01); *H05K 2201/0959* (2013.01)
(58) Field of Classification Search
 CPC ........ H05K 1/112; H05K 1/115; H05K 1/116; H05K 1/165; H05K 2201/0959; H05K 2201/096; H05K 2201/09536; H05K 2201/086; H05K 2201/09809; H05K 3/4602; H05K 3/4644; H05K 3/429; H01L 21/486; H01L 23/49827; H01L 23/49816; H01L 23/49822
 See application file for complete search history.

(56) References Cited

U.S. PATENT DOCUMENTS

| | | | |
|---|---|---|---|
| 2008/0011507 A1* | 1/2008 | Vasoya | H05K 1/0313 361/748 |
| 2009/0126983 A1* | 5/2009 | Harvey | H05K 1/115 174/266 |
| 2019/0274217 A1* | 9/2019 | Zhang | H01L 23/49827 |
| 2019/0385777 A1 | 12/2019 | Kodama et al. | |

FOREIGN PATENT DOCUMENTS

JP    2019-220504    12/2019

\* cited by examiner

*Primary Examiner* — Roshn K Varghese
(74) *Attorney, Agent, or Firm* — IPUSA, PLLC

(57) ABSTRACT

A wiring board includes an insulating base having a first principal surface, and a second principal surface opposite to the first principal surface, a first through hole formed in the base, a first conductive layer provided inside the first through hole, a first insulating layer covering the first principal surface, a second insulating layer covering the second principal surface, a second through hole formed in the first insulating layer, the base, and the second insulating layer, a magnetic material provided inside the second through hole, a third through hole famed in the magnetic material, and a second conductive layer provided inside the third through hole.

13 Claims, 34 Drawing Sheets

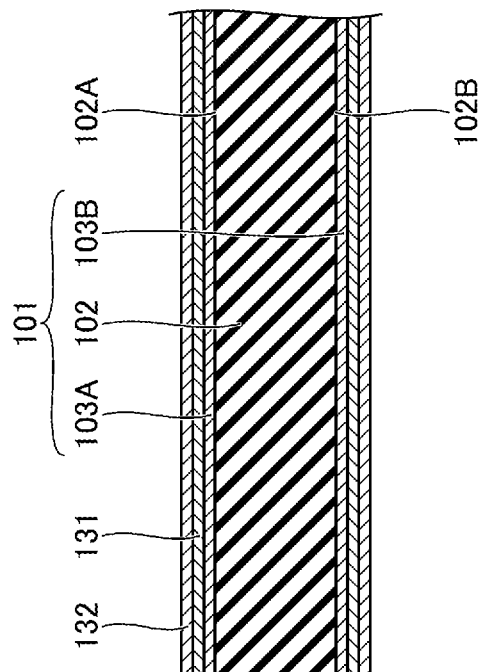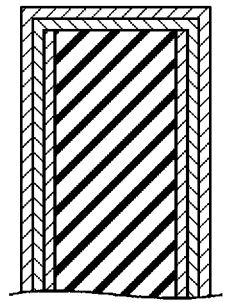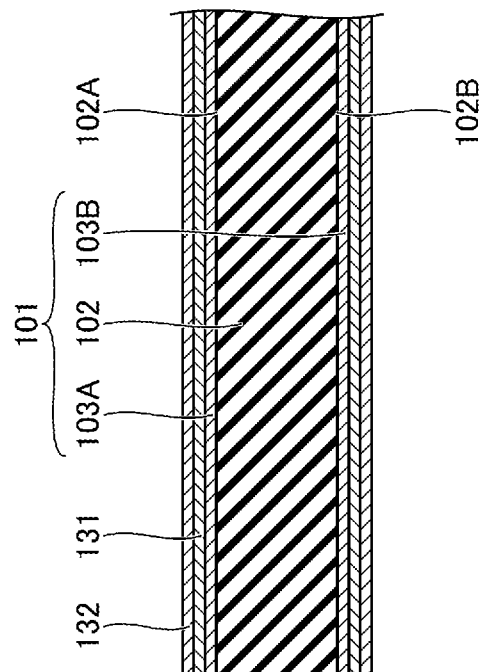
FIG.3A
FIG.3B

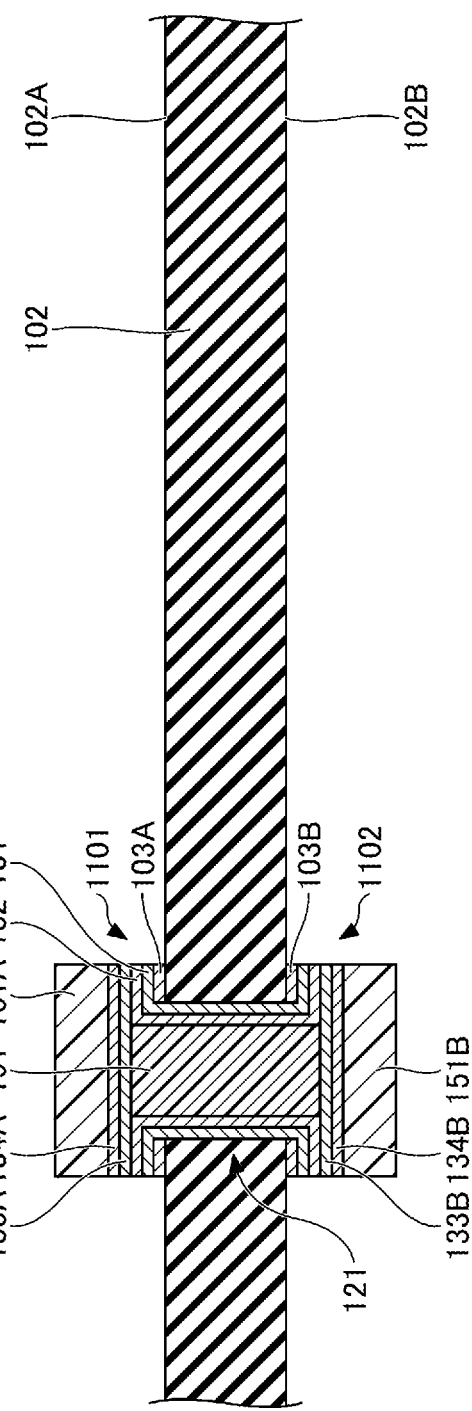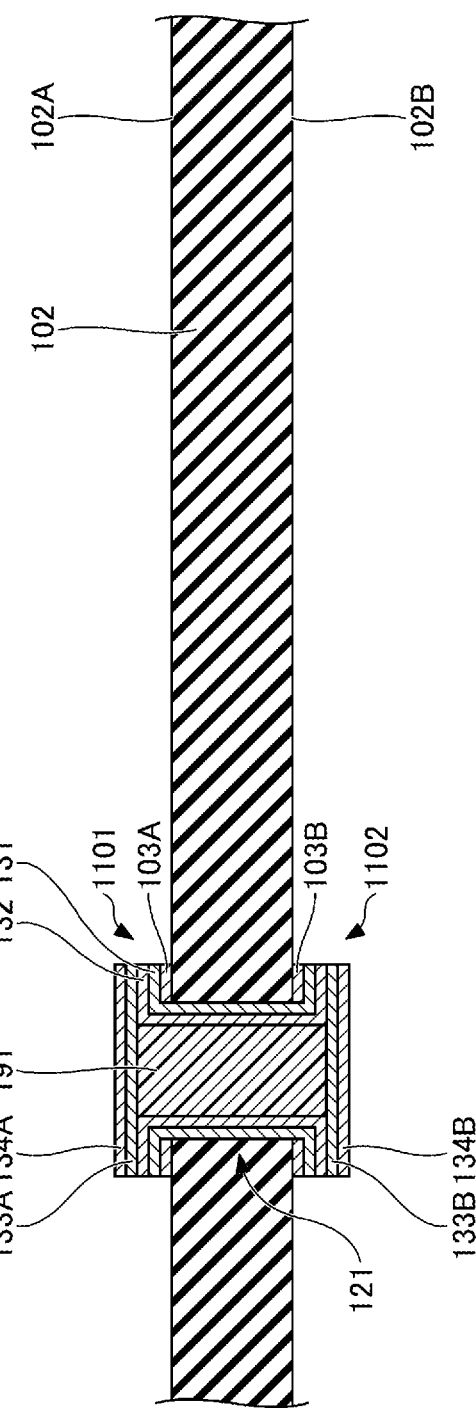

WIRING BOARD

CROSS-REFERENCE TO RELATED APPLICATIONS

This application is based upon and claims priority to Japanese Patent Application No. 2021-076129, filed on Apr. 28, 2021, the entire contents of which are incorporated herein by reference.

FIELD

The present disclosure relates to wiring boards, and methods for manufacturing wiring boards.

BACKGROUND

As an example of a wiring board, a board having an internal inductor and including a magnetic resin embedded inside a through hole formed in a core substrate, is proposed in Japanese Laid-Open Patent Publication No. 2019-220504, for example.

In order to increase inductance using a conventional wiring board including the magnetic resin, the core substrate needs to be thick. But when the core substrate is thick, it takes a long time to form a through hole, thereby greatly deteriorating the production efficiency.

SUMMARY

One object according to one aspect of the present disclosure is to provide a wiring board and a method for manufacturing the wiring board, which can increase the inductance while reducing the deterioration of the production efficiency.

According to one aspect of the present disclosure, a wiring board includes an insulating base having a first principal surface, and a second principal surface opposite to the first principal surface; a first through hole famed in the base; a first conductive layer provided inside the first through hole; a first insulating layer covering the first principal surface; a second insulating layer covering the second principal surface; a second through hole formed in the first insulating layer, the base, and the second insulating layer; a magnetic material provided inside the second through hole; a third through hole famed in the magnetic material; and a second conductive layer provided inside the third through hole.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 3A and FIG. 3B are cross sectional views (part 2) illustrating the method for manufacturing the wiring board according to the first embodiment;

FIG. 5A and FIG. 5B are cross sectional views (part 4) illustrating the method for manufacturing the wiring board according to the first embodiment;

DESCRIPTION OF EMBODIMENTS

Figure 1:
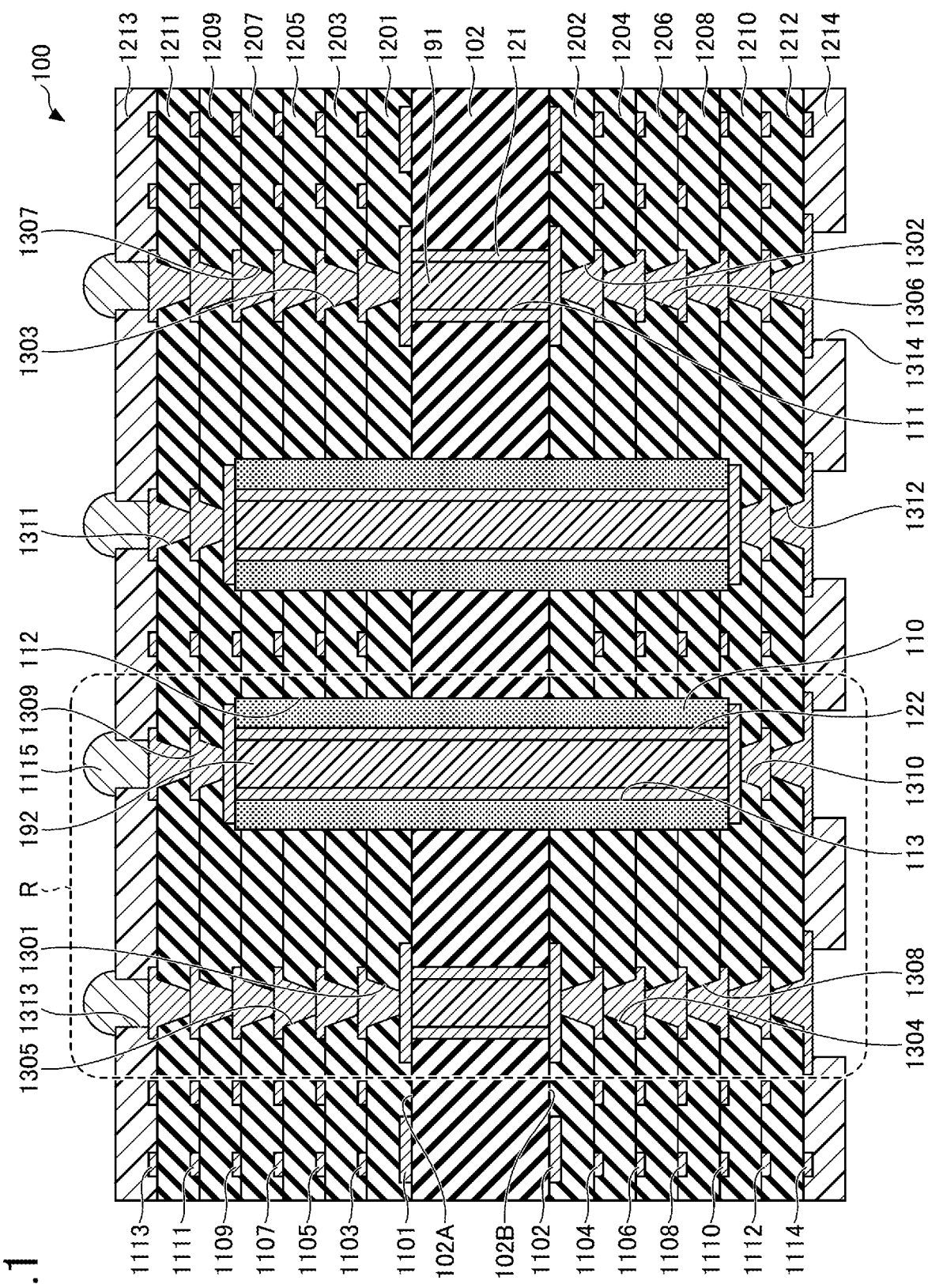
FIG. 1 is a cross sectional view illustrating a configuration of a wiring board according to a first embodiment.

Preferred embodiments of the present invention will be described with reference to the accompanying drawings. In the drawings, those constituent elements that have substantially the same functional configurations are designated by the same reference numerals, and a repeated description of the same parts may be omitted.

First Embodiment

First, a first embodiment will be described. The first embodiment relates to a wiring board.

Configuration of Wiring Board

First, a configuration of the wiring board will be described. FIG. 1 is a cross sectional view illustrating the configuration of the wiring board according to the first embodiment.

As illustrated in FIG. 1, a wiring board 100 according to the first embodiment includes an insulating base 102 which functions as a support. The base 102 is formed of an insulating material, such as glass epoxy resins, bismaleimide triazine resins, or the like. The base 102 includes a first principal surface 102A, and a second principal surface 102B opposite the first principal surface 102A.

A first through hole 111 is formed to penetrate the base 102 in a thickness direction thereof. The first through hole 111 has a diameter in a range of 150 µm to 250 µm, for example. A first penetrating conductive via 121 is provided inside the first through hole 111. The first penetrating conductive via 121 is provided on a wall defining the first through hole 111. An insulating first filler material 191 is provided to fill an inner portion of the first penetrating conductive via 121 inside the first through hole 111. The first filler material 191 includes a resin, for example. The first filler material 191 may further include a filler.

A first interconnect layer 1101 is formed on the first principal surface 102A, and a second interconnect layer 1102 is formed on the second principal surface 102B. The first interconnect layer 1101 and the second interconnect layer 1102 are connected to the first penetrating conductive via 121. In other words, the first interconnect layer 1101 and the second interconnect layer 1102 are interconnected through the first penetrating conductive via 121.

A first insulating layer 1201 is formed on the first principal surface 102A. A via hole 1301, that reaches a connecting portion of the first interconnect layer 1101, is formed in the first insulating layer 1201, and a third interconnect layer 1103, that is connected to the first interconnect layer 1101 through a via conductor (or via interconnect) inside the via hole 1301, is famed on the first insulating layer 1201. Further, a third insulating layer 1203 is formed on the first insulating layer 1201. A via hole 1303, that reaches a connecting portion of the third interconnect layer 1103, is formed in the third insulating layer 1203, and a fifth interconnect layer 1105, that is connected to the third interconnect layer 1103 through a via conductor inside the via hole 1303, is formed on the third insulating layer 1203.

A fifth insulating layer 1205 is famed on the third insulating layer 1203. A via hole 1305, that reaches a connecting portion of the fifth interconnect layer 1105, is formed in the fifth insulating layer 1205, and a seventh interconnect layer 1107, that is connected to the fifth interconnect layer 1105 through a via conductor inside the via hole 1305, is formed on the fifth insulating layer 1205. Moreover, a seventh insulating layer 1207 is formed on the fifth insulating layer 1205. A via hole 1307, that reaches a connecting portion of the seventh interconnect layer 1107, is formed in the seventh insulating layer 1207, and a ninth interconnect layer 1109, that is connected to the seventh interconnect layer 1107 through a via conductor inside the via hole 1307, is formed on the seventh insulating layer 1207.

A second insulating layer 1202 is formed on the second principal surface 102B. A via hole 1302, that reaches a connecting portion of the second interconnect layer 1102, is formed in the second insulating layer 1202, and a fourth interconnect layer 1104, that is connected to the second interconnect layer 1102 through a via conductor inside the via hole 1302, is formed on the second insulating layer 1202. In addition, a fourth insulating layer 1204 is formed on the second insulating layer 1202. A via hole 1304, that reaches a connecting portion of the fourth interconnect layer 1104, is famed in the fourth insulating layer 1204, and a sixth interconnect layer 1106, that is connected to the fourth interconnect layer 1104 through a via conductor inside the via hole 1304, is formed on the fourth insulating layer 1204.

A sixth insulating layer 1206 is famed on the fourth insulating layer 1204. A via hole 1306, that reaches a connecting portion of the sixth interconnect layer 1106, is formed in the sixth insulating layer 1206, and an eighth interconnect layer 1108, that is connected to the sixth interconnect layer 1106 through a via conductor inside the via hole 1306, is formed on the sixth insulating layer 1206. Further, an eighth insulating layer 1208 is formed on the sixth insulating layer 1206. A via hole 1308, that reaches the connecting portion of the eighth interconnect layer 1108, is famed in the eighth insulating layer 1208, and a tenth interconnect layer 1110, that is connected to the eighth interconnect layer 1108 through the via conductor inside the via hole 1308, is formed on the eighth insulating layer 1208.

A second through hole 112 is formed to penetrate the seventh insulating layer 1207, the fifth insulating layer 1205, the third insulating layer 1203, the first insulating layer 1201, the base 102, the second insulating layer 1202, the fourth insulating layer 1204, the sixth insulating layer 1206, and the eighth insulating layer 1208 in a thickness direction thereof. The second through hole 112 is formed at a position separated from the first through hole 111 in an in-plane direction that is perpendicular to the thickness direction of the base 102. The second through hole 112 has a diameter greater than the diameter of the first through hole 111, and the diameter of the second through hole 112 is in a range of 350 µm to 450 µm, for example.

A magnetic material 110 is provided inside the second through hole 112. The magnetic material 110 includes a resin, such as epoxy resin, polyimide resins, or the like, and magnetic particles dispersed in the resin, for example. Examples of the magnetic particles include a filler, such as iron oxide, ferrite, or the like. The magnetic material 110 has a surface that is farther away from the first principal surface 102A than the surface of the seventh insulating layer 1207, and a surface that is farther away from the second principal surface 102B than the surface of the eighth insulating layer 1208.

A third through hole 113 is famed to penetrate the magnetic material 110 in a thickness direction thereof. The third through hole 113 has a diameter smaller than the diameter of the second through hole 112, and the diameter of the third through hole 113 is in a range of 150 µm to 250 µm, for example. A second penetrating conductive via 122 is provided inside the third through hole 113. The second penetrating conductive via 122 is provided on a wall defining the third through hole 113. An insulating second filler material 192 is provided to fill an inner portion of the second penetrating conductive via 122 inside the third through hole 113. The second filler material 192 includes a resin, for example. The second filler material 192 may further include a filler.

A ninth interconnect layer 1109 and a tenth interconnect layer 1110 are connected to the second penetrating conductive via 122. In other words, the ninth interconnect layer 1109 and the tenth interconnect layer 1110 are interconnected through the second penetrating conductive via 122.

The first insulating layer 1201, the third insulating layer 1203, the fifth insulating layer 1205, and the seventh insulating layer 1207 are examples of a first insulating layer. An arbitrary number of first insulating layers may be provided. In other words, the first insulating layer may be famed by one insulating layer or by laminating two or more insulating layers. The second insulating layer 1202, the fourth insulating layer 1204, the sixth insulating layer 1206, and the eighth insulating layer 1208 are examples of a second insulating layer. An arbitrary number of second insulating layers may be provided. In other words, the second insulating layer may be famed by one insulating layer or by laminating two or more insulating layers. The first interconnect layer 1101 is an example of a first interconnect layer. The second interconnect layer 1102 is an example of a second interconnect layer. The ninth interconnect layer 1109 is an example of a third interconnect layer. The tenth interconnect layer 1110 is an example of a fourth interconnect layer. The first penetrating conductive via 121 is an example of a first conductive layer. The second penetrating conductive via 122 is an example of a second conductive layer.

A ninth insulating layer 1209 is famed on the seventh insulating layer 1207. A via hole 1309, that reaches a connecting portion of the ninth interconnect layer 1109, is formed in the ninth insulating layer 1209, and an eleventh interconnect layer 1111, that is connected to the ninth interconnect layer 1109 through a via conductor inside the via hole 1309, is formed on the ninth insulating layer 1209.

In addition, an eleventh insulating layer 1211 is formed on the ninth insulating layer 1209. A via hole 1311, that reaches a connecting portion of the eleventh interconnect layer 1111, is formed in the eleventh insulating layer 1211, and a thirteenth interconnect layer 1113, that is connected to the eleventh interconnect layer 1111 through a via conductor inside the via hole 1311, is formed on the eleventh insulating layer 1211.

A solder resist layer 1213 is formed on the eleventh insulating layer 1211. An opening 1313, that reaches a connecting portion of the thirteenth interconnect layer 1113, is formed in the solder resist layer 1213. A connection terminal 1115, that protrudes above the solder resist layer 1213 through the opening 1313, is formed on the connecting portion of the thirteenth interconnect layer 1113. The connection terminal 1115 may include a post and a bumps on the post. An electrode of a semiconductor chip is connected to the connection terminal 1115.

A tenth insulating layer 1210 is formed on the eighth insulating layer 1208. A via hole 1310, that reaches the connecting portion of the tenth interconnect layer 1110, is formed in the tenth insulating layer 1210, and a twelfth interconnect layer 1112, that is connected to the tenth interconnect layer 1110 through a via conductor inside the via hole 1310, is formed on the tenth insulating layer 1210. In addition, A twelfth insulating layer 1212 is formed on the tenth insulating layer 1210. A via hole 1312, that reaches a connecting portion of the twelfth interconnect layer 1112, is formed in the twelfth insulating layer 1212, and a fourteenth interconnect layer 1114, that is connected to the twelfth interconnect layer 1112 through a via conductor inside the via hole 1312, is formed on the twelfth insulating layer 1212.

A solder resist layer 1214 is formed on the twelfth insulating layer 1212. An opening 1314, that reaches a connecting portion of the fourteenth interconnect layer 1114, is formed in the solder resist layer 1214.

Method For Manufacturing Wiring Board

Next, a method for manufacturing the wiring board according to the first embodiment will be described. FIG. 2A through FIG. 19 are cross sectional views illustrating the method for manufacturing the wiring board according to the first embodiment. FIG. 2A through FIG. 19 illustrate, in detail, a region R in FIG. 1.

Figure 2A:
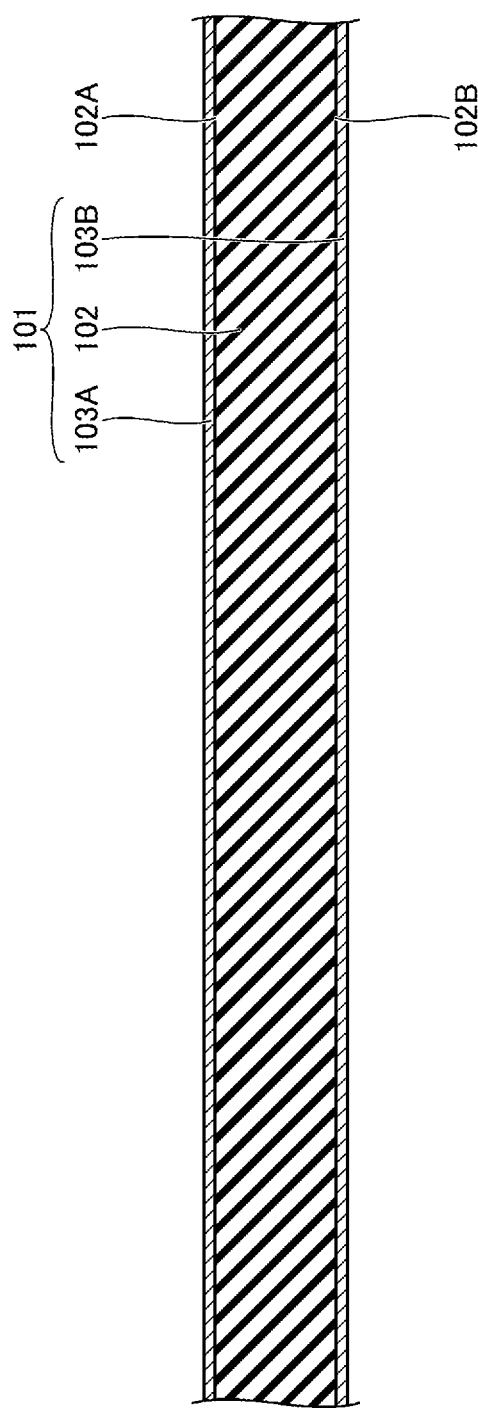
FIG. 2A and FIG. 2B are cross sectional views (part 1) illustrating a method for manufacturing the wiring board according to the first embodiment.

First, as illustrated in FIG. 2A, a laminate 101 including the insulating base 102, a conductive film 103A, and a conductive film 103B, is prepared. The base 102 includes a first principal surface 102A, and a second principal surface 102B opposite the first principal surface 102A. The conductive film 103A is provided on the first principal surface 102A, and the conductive film 103B is provided on the second principal surface 102B. The conductive films 103A and 103B are copper films, for example. A large base or substrate from which a plurality of wiring boards 100 can be obtained, is used as the laminate 101. In other words, the laminate 101 has a plurality of regions where structures corresponding to the wiring board 100 are formed.

Figure 2B:
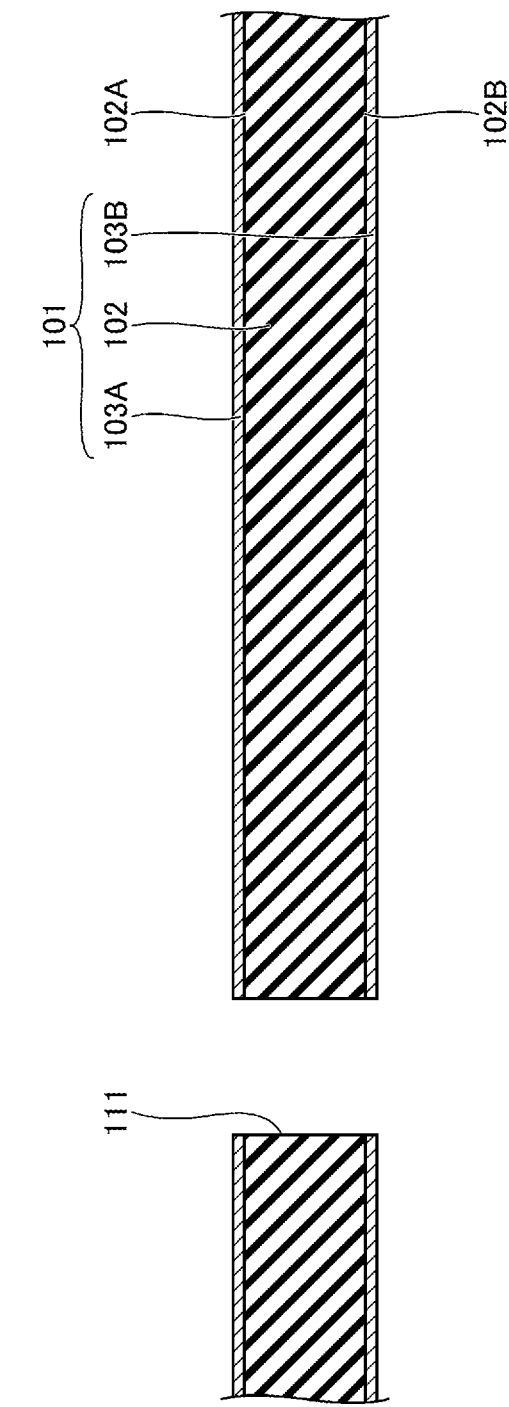

Next, as illustrated in FIG. 2B, the first through hole 111, that penetrates the laminate 101 in a thickness direction thereof, is formed in the laminate 101. The first through hole 111 penetrates the conductive film 103A, the base 102, and the conductive film 103B in a thickness direction thereof. The first through hole 111 may be formed by drilling, laser beam machining, or the like, for example. Thereafter, a desmear process is performed on the wall defining the first through hole 111. The desmear process refers to a process that removes resin residue (or smear). The desmear process may be performed using a potassium permanganate solution, for example. The first through hole 111 has a diameter in a range of 150 µm to 250 µm, for example.

Thereafter, as illustrated in FIG. 3A, an electroless copper plating film 131 is formed on the surface of the conductive film 103A, on the surface of the conductive film 103B, and on the wall defining the first through hole 111. Next, an electrolytic copper plating film 132 is formed on the electroless copper plating film 131 by electrolytic plating that utilizes the electroless copper plating film 131 as a plating power feed path. The electroless copper plating film 131 has a thickness in a range of 0.3 µm to 1.0 µm, for example, and electrolytic copper plating film 132 has a thickness in a range of 10 µm to 50 µm, for example.

Next, as illustrated in FIG. 3B, the first filler material 191 is filled inside the first through hole 111. The first filler material 191 may be filled by screen printing, for example. The first filler material 191 is provided on the electrolytic copper plating film 132 inside the first through hole 111. Thereafter, the first filler material 191 is cured. In a case where the first filler material 191 includes a thermosetting resin, such as an epoxy resin or the like, the first filler material 191 can be cured by a heat treatment (or heating process). The first filler material 191 is filled so as to protrude from the surfaces on both sides of the electrolytic copper plating film 132, in order to avoid insufficient filling of the first filler material 191.

Then, the first filler material 191 is polished until the surface of the electrolytic copper plating film 132 is exposed. As a result of this polishing, the first filler material 191 has a surface that coincides with the surface of the electrolytic copper plating film 132. The first filler material 191 may be polished by chemical mechanical polishing (CMP), for example. The portion of the first filler material 191 protruding from the surface of the electrolytic copper plating film 132 may be removed by buffing or roll polishing.

Figure 4A:
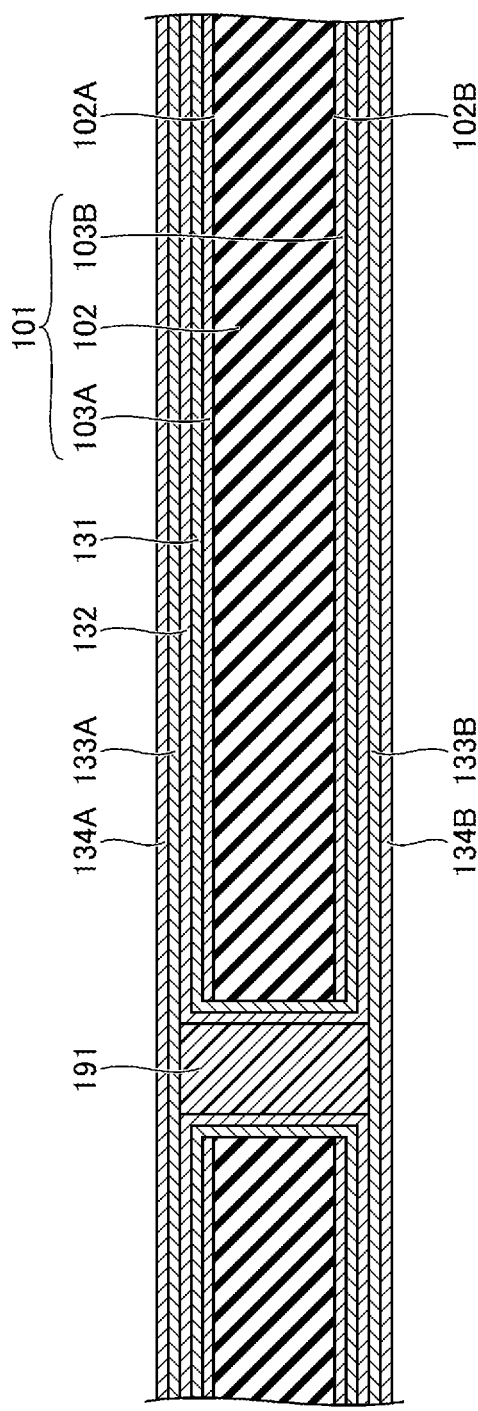
FIG. 4A and FIG. 4B are cross sectional views (part 3) illustrating the method for manufacturing the wiring board according to the first embodiment.

Next, as illustrated in FIG. 4A, an electroless copper plating film 133A is formed on the surface of the electrolytic copper plating film 132, and on the surface of first filler material 191 that coincides with the surface of the electrolytic copper plating film 132, on the side where the first principal surface 102A is disposed. Similarly, an electroless copper plating film 133B is formed on the surface of the electrolytic copper plating film 132, and on the surface of the first filler material 191 that coincides with the surface of the electrolytic copper plating film 132, on the side where the second principal surface 102B is disposed. Thereafter, the electrolytic copper plating film 134A is formed on the electroless copper plating film 133A by electrolytic plating that utilizes the electroless copper plating film 133A as a plating power feeding path. In addition, the electrolytic copper plating film 134B is famed on the electroless copper plating film 133B by electrolytic plating that utilizes the electroless copper plating film 133B as a plating power feeding path. The electroless copper plating films 133A and 133B have a thickness in a range of 0.3 µm to 1.0 µm, for example. The electrolytic copper plating films 134A and 134B have a thickness in a range of 15 µm to 40 µm, for example.

Figure 4B:
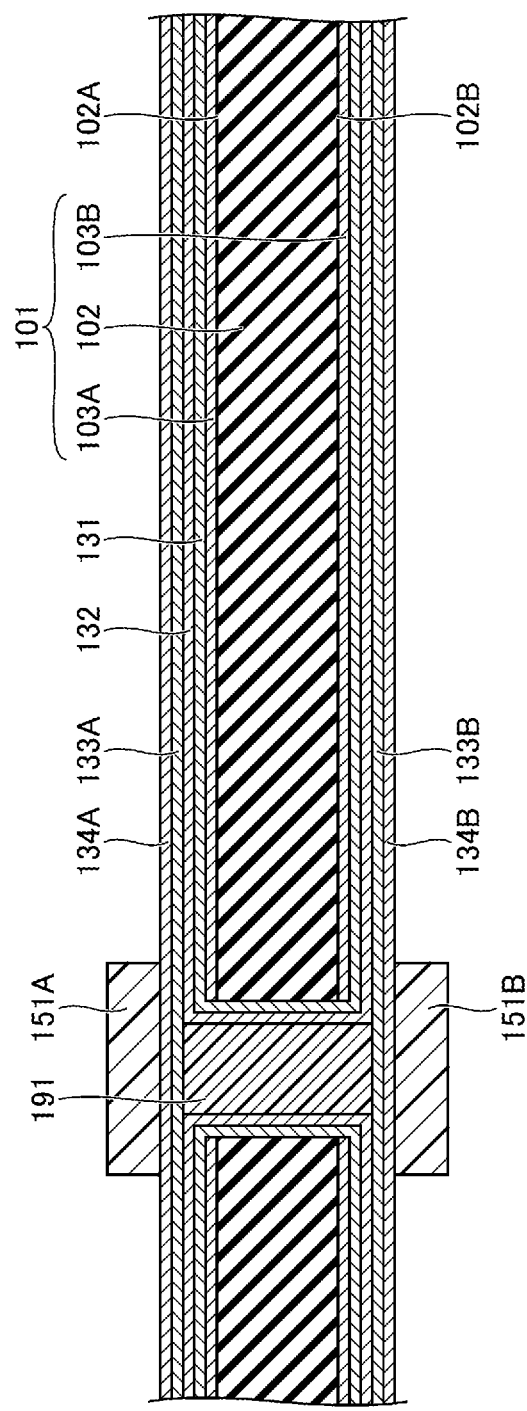

Then, as illustrated in FIG. 4B, a resist layer 151A, having a pattern of the first interconnect layer 1101, is formed on the electrolytic copper plating film 134A, and a resist layer 151B, having a pattern of the second interconnect layer 1102, is famed on the electrolytic copper plating film 134B. The resist layers 151A and 151B may be dry films or the like, for example, and the patterns may be formed in the resist layers 151A and 151B by exposing and developing processes.

Next, as illustrated in FIG. 5A, the resist layer 151A is used as a mask, to etch the electrolytic copper plating film 134A, the electroless copper plating film 133A, the electrolytic copper plating film 132, the electroless copper plating film 131, and the conductive film 103A. In addition, the resist layer 151B is used as a mask, to etch the electrolytic copper plating film 134B, the electroless copper plating film 133B, the electrolytic copper plating film 132, the electroless copper plating film 131, and the conductive film 103B. As a result, the first penetrating conductive via 121, the first interconnect layer 1101, and the second interconnect layer 1102 are obtained. The first penetrating conductive via 121 includes portions of the electroless copper plating film 131 and the electrolytic copper plating film 132 between the first principal surface 102A and the second principal surface 102B. The first interconnect layer 1101 includes the conductive film 103A, portions of the electroless copper plating film 131 and the electrolytic copper plating film 132 closer to the side where the electroless copper plating film 133A is disposed than to the first principal surface 102A, the electroless copper plating film 133A, and the electrolytic copper plating film 134A. The second interconnect layer 1102 includes a conductive film 103B, portions of the electroless copper plating film 131 and the electrolytic copper plating film 132 closer to the side where the electroless copper plating film 133B is disposed than to the second principal surface 102B, the electroless copper plating film 133B, and the electrolytic copper plating film 134B.

Then, as illustrated in FIG. 5B, the resist layers 151A and 151B are removed.

Figure 6:
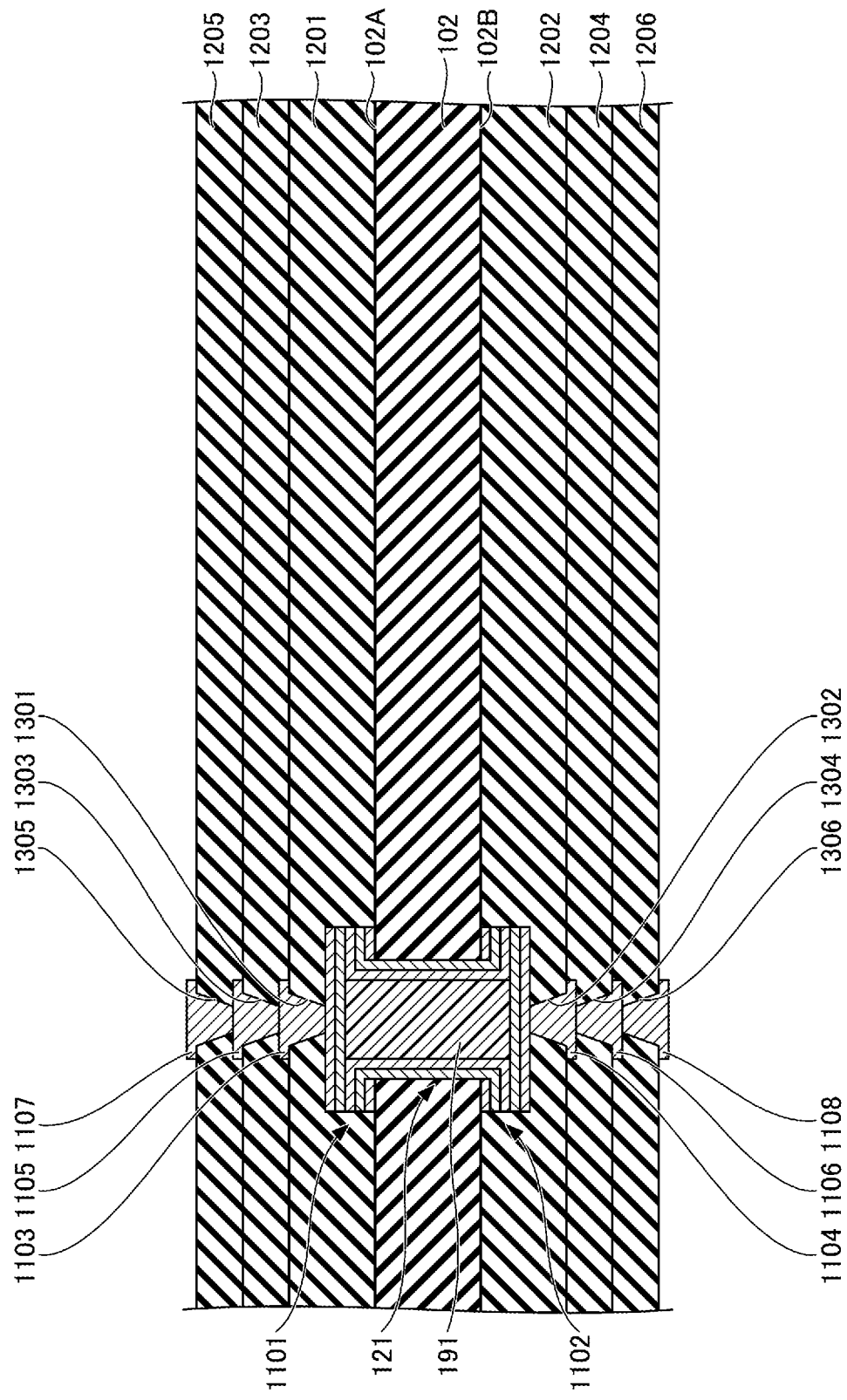
FIG. 6 is a cross sectional view (part 5) illustrating the method for manufacturing the wiring board according to the first embodiment.

Next, as illustrated in FIG. 6, an uncured resin film is adhered on the first principal surface 102A, so as to cover the first interconnect layer 1101, and an uncured resin film is adhered on the second principal surface 102B, so as to cover the second interconnect layer 1102. Thereafter, a heat treatment is performed to cure these resin films, to form the first insulating layer 1201 and the second insulating layer 1202. The first insulating layer 1201 and the second insulating layer 1202 are formed of an insulating resin, such as epoxy resins, polyimide resins, or the like. The first insulating layer 1201 and the second insulating layer 1202 may be formed by coating a liquid resin. Then, the via hole 1301 reaching the connecting portion of the first interconnect layer 1101 is formed in the first insulating layer 1201, and the via hole 1302 reaching the connecting portion of the second interconnect layer 1102 is famed in the second insulating layer 1202, by performing laser beam machining with respect to the first insulating layer 1201 and the second insulating layer 1202, respectively.

Next, as also illustrated in FIG. 6, the third interconnect layer 1103, that is connected to the first interconnect layer 1101 through the via conductor inside the via hole 1301, is famed on the first insulating layer 1201. The fourth interconnect layer 1104, that is connected to the second interconnect layer 1102 through the via conductor inside the via hole 1302, is formed on the second insulating layer 1202.

The third interconnect layer 1103 and the fourth interconnect layer 1104 may be formed by the semi-additive method. A method for forming the third interconnect layer 1103 will be described in detail. First, a seed layer (not illustrated) made of copper or the like is formed on the first insulating layer 1201 and on an inner surface defining the via hole 1301, by electroless plating or sputtering. Next, a plating resist layer (not illustrated) having an opening at a portion where the third interconnect layer 1103 is to be formed, is formed on the seed layer. Then, a metal plating layer made of copper or the like is formed in the opening of the plating resist layer, by electrolytic plating that utilizes the seed layer as a power feeding path. Thereafter, the plating resist layer is removed. Next, the metal plating layer is used as a mask, to remove the seed layer by wet etching. In this manner, it is possible to form the third interconnect layer 1103 including the seed layer and the metal plating layer. The fourth interconnect layer 1104 can be formed in a manner similar to the third interconnect layer 1103. For the sake of simplifying the drawings, the third interconnect layer 1103 and the fourth interconnect layer 1104 are illustrated as integrally including the seed layer and the metal plating layer.

Next, as also illustrated in FIG. 6, the third insulating layer 1203 is formed on the first insulating layer 1201, so as to cover the third interconnect layer 1103. In addition, the fourth insulating layer 1204 is formed on the second insulating layer 1202, so as to cover the fourth interconnect layer 1104. The third insulating layer 1203 and the fourth insulating layer 1204 can be formed in a manner similar to the first insulating layer 1201 and the second insulating layer 1202. Then, by performing laser beam machining with respect to the third insulating layer 1203 and the fourth insulating layer 1204, a via hole 1303, that reaches a connecting portion of the third interconnect layer 1103, is formed in the third insulating layer 1203, and a via hole 1304, that reaches a connecting portion of the fourth interconnect layer 1104, is famed in the fourth insulating layer 1204. The via hole 1303 and via hole 1304 can be formed in a manner similar to the via hole 1301 and via hole 1302.

Further, as also illustrated in FIG. 6, a fifth interconnect layer 1105, that is connected to the third interconnect layer 1103 through a via conductor inside the via hole 1303, is formed on the third insulating layer 1203, and a sixth interconnect layer 1106, that is connected to the fourth interconnect layer 1104 through a via conductor inside the via hole 1304, is formed on the fourth insulating layer 1204. The fifth interconnect layer 1105 and the sixth interconnect layer 1106 can be formed in a manner similar to the third interconnect layer 1103 and the fourth interconnect layer 1104.

Next, as also illustrated in FIG. 6, a fifth insulating layer 1205 is formed on the third insulating layer 1203, so as to cover the fifth interconnect layer 1105. In addition, a sixth insulating layer 1206 is formed on the fourth insulating layer 1204, so as to cover the sixth interconnect layer 1106. The fifth insulating layer 1205 and the sixth insulating layer 1206 can be formed in a manner similar to the first insulating layer 1201 and the second insulating layer 1202. Then, by performing laser beam machining with respect to the fifth insulating layer 1205 and the sixth insulating layer 1206, a via hole 1305, that reaches a connecting portion of the fifth interconnect layer 1105, is formed in the fifth insulating layer 1205, and a via hole 1306, that reaches a connecting portion of the sixth interconnect layer 1106, is famed in the sixth insulating layer 1206. The via hole 1305 and the via hole 1306 can be formed in a manner similar to the via hole 1301 and the via hole 1302.

Further, as also illustrated in FIG. 6, a seventh interconnect layer 1107, that is connected to the fifth interconnect layer 1105 through a via conductor inside the via hole 1305, is formed on the fifth insulating layer 1205, and an eighth interconnect layer 1108, that is connected to the sixth interconnect layer 1106 through a via conductor inside the via hole 1306, is formed on the sixth insulating layer 1206. The seventh interconnect layer 1107 and the eighth interconnect layer 1108 can be formed in a manner similar to the third interconnect layer 1103 and the fourth interconnect layer 1104.

Figure 7:
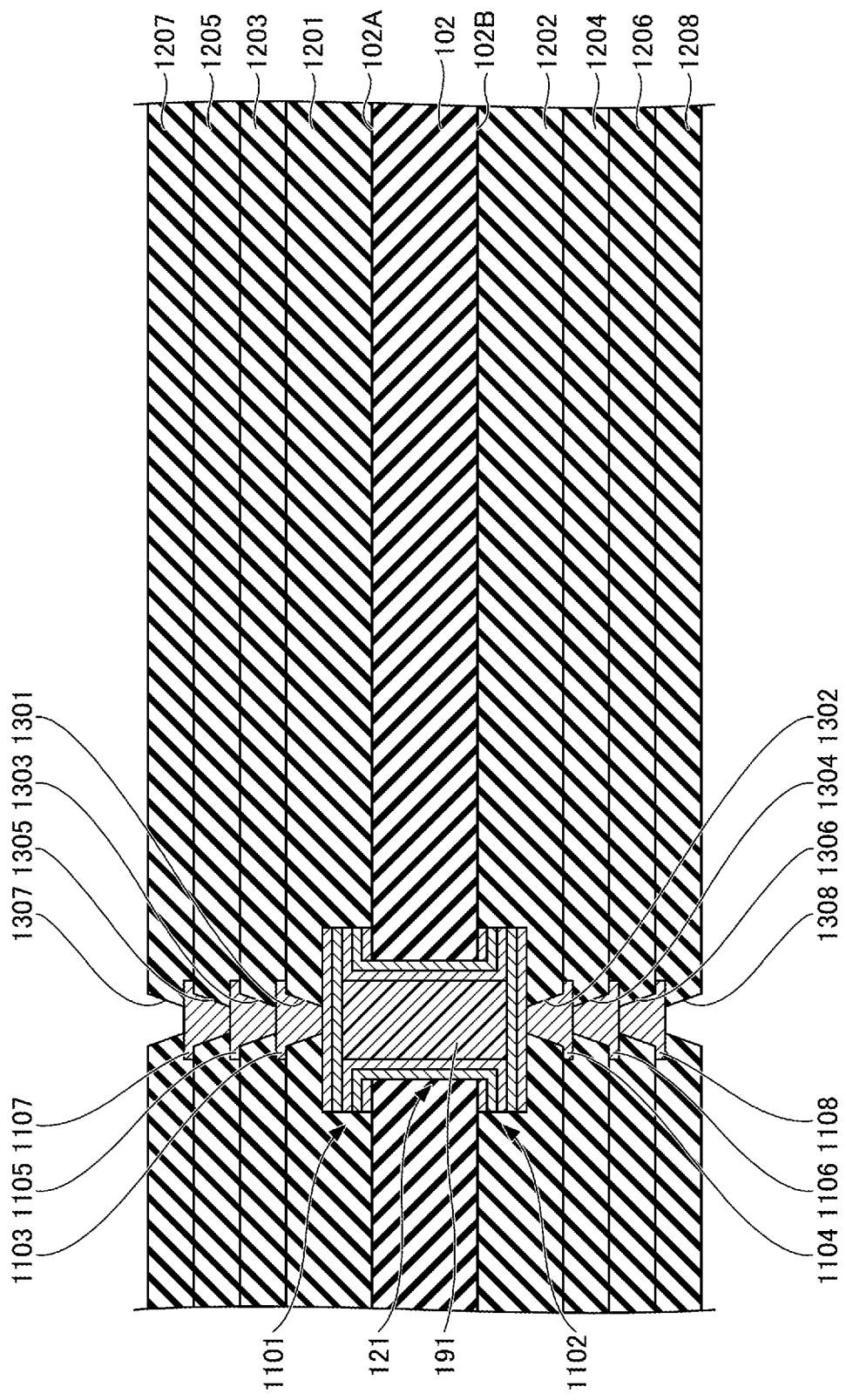
FIG. 7 is a cross sectional view (part 6) illustrating the method for manufacturing the wiring board according to the first embodiment.

Next, as illustrated in FIG. 7, an uncured resin film is adhered on the fifth insulating layer 1205, so as to cover the seventh interconnect layer 1107, and an uncured resin film is adhered on the sixth insulating layer 1206, so as to cover the eighth interconnect layer 1108. Thereafter, the resin films are cured by performing a heat treatment, so as to form the seventh insulating layer 1207 and the eighth insulating layer 1208. The seventh insulating layer 1207 and the eighth insulating layer 1208 are formed of an insulating resin, such as epoxy resins, polyimide resins, or the like. A liquid resin may be coted to form the seventh insulating layer 1207 and the eighth insulating layer 1208. Next, by performing laser beam machining with respect to the seventh insulating layer 1207 and the eighth insulating layer 1208, a via hole 1307, that reaches a connecting portion of the seventh interconnect layer 1107, is famed in the seventh insulating layer 1207, and a via hole 1308, that reaches a connecting portion of the eighth interconnect layer 1108, is formed in the eighth insulating layer 1208.

Figure 8:
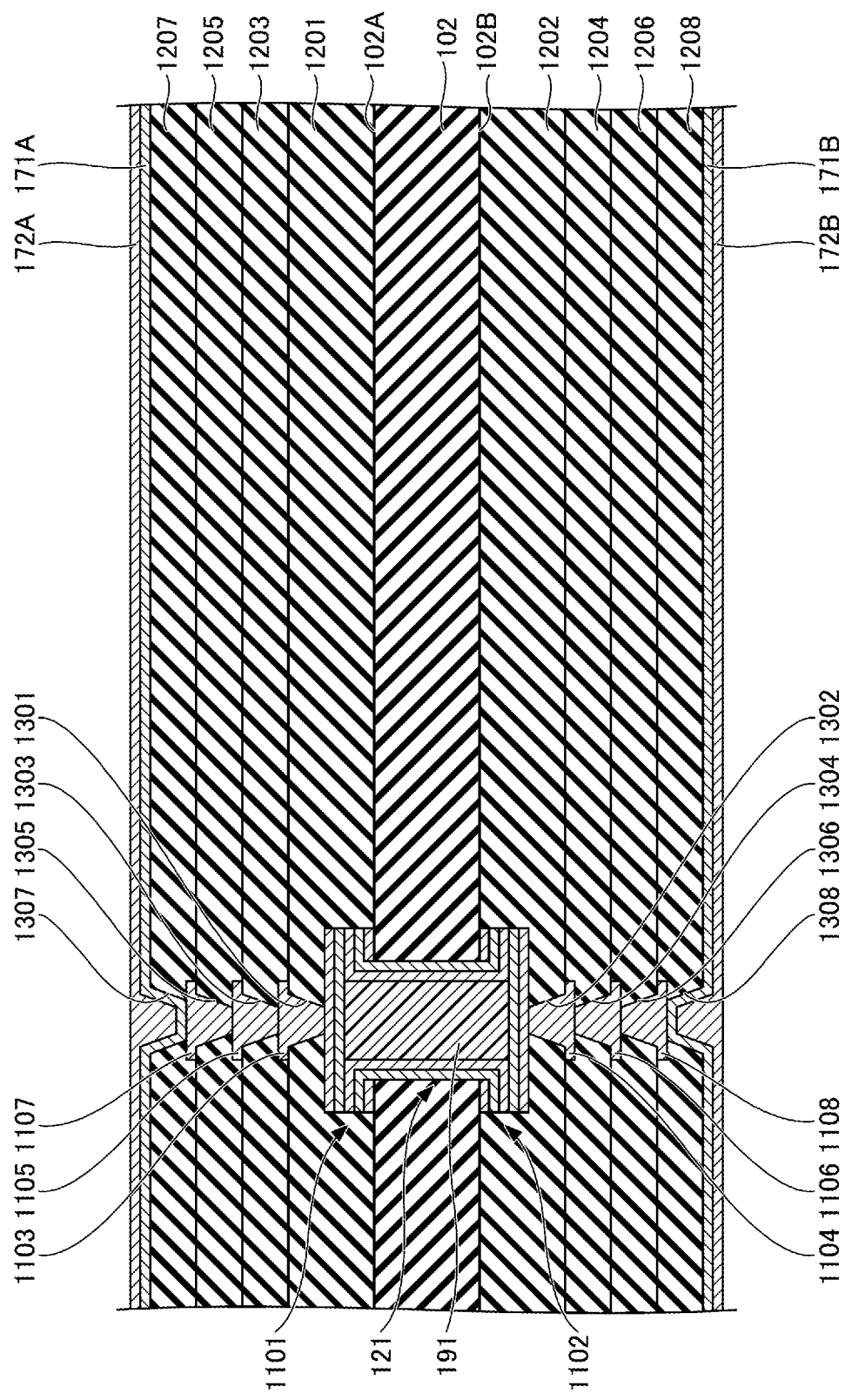
FIG. 8 is a cross sectional view (part 7) illustrating the method for manufacturing the wiring board according to the first embodiment.

Next, as illustrated in FIG. 8, an electroless copper plating film 171A is formed on the seventh insulating layer 1207, and on an inner surface defining the via hole 1307. Similarly, an electroless copper plating film 171B is formed on the eighth insulating layer 1208, and on an inner surface defining the via hole 1308. Thereafter, the electrolytic copper plating film 172A is formed on the electroless copper plating film 171A, by electrolytic plating that utilizes the electroless copper plating film 171A as a plating power feeding path, and the electrolytic copper plating film 172B is famed on the electroless copper plating film 171B, by electrolytic plating that utilizes the electroless copper plating film 171B as a plating power feeding path. The electroless copper plating films 171A and 171B have a thickness in a range of 0.3 μm to 1.0 μm, for example, and the electrolytic copper plating films 172A and 172B have a thickness in a range of 15 μm to 40 μm, for example. The electrolytic copper plating film 172A fills the inside of the via hole 1307. In addition, the electrolytic copper plating film 172B fills the inside of the via hole 1308.

Figure 9:
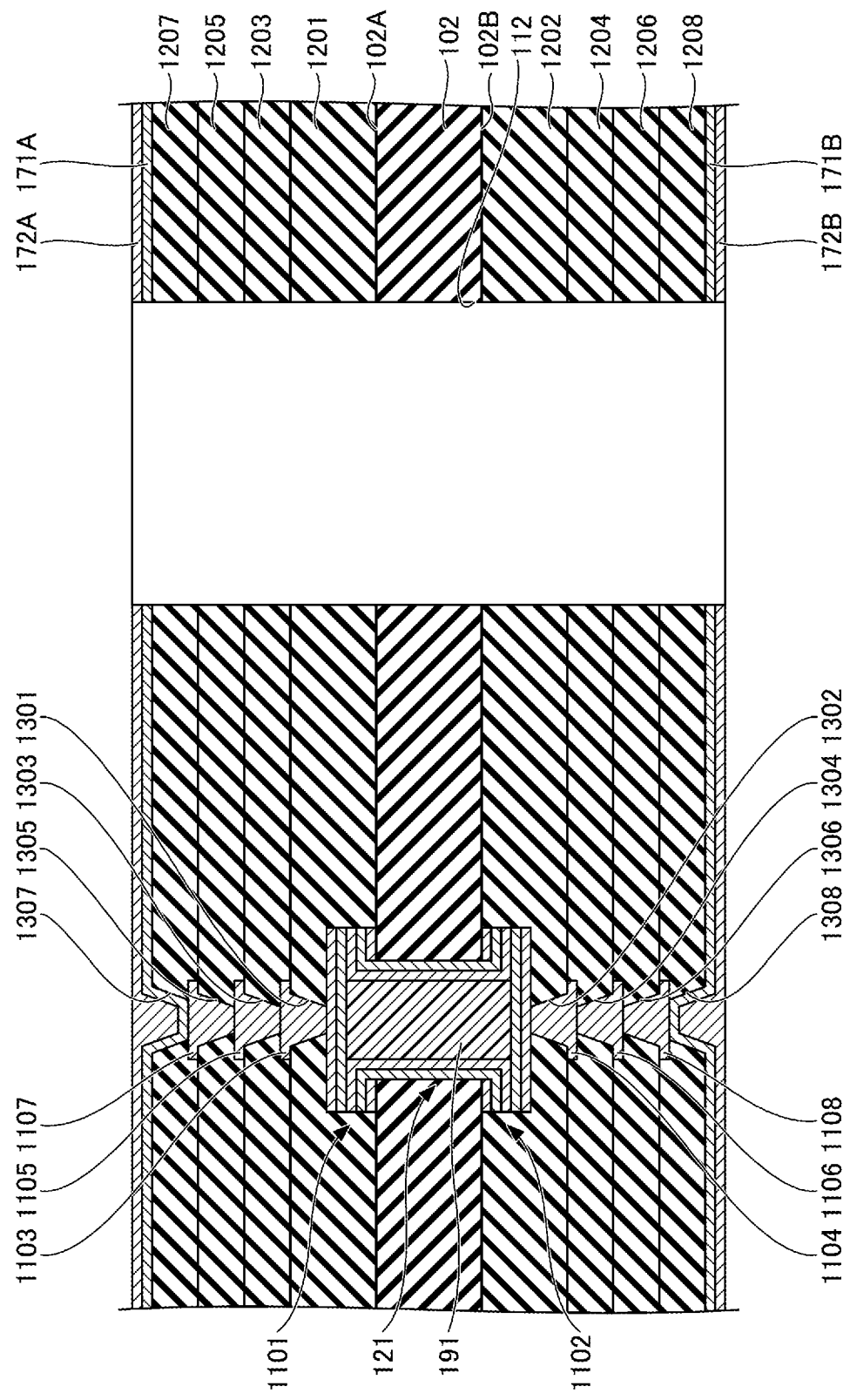
FIG. 9 is a cross sectional view (part 8) illustrating the method for manufacturing the wiring board according to the first embodiment.

Next, as illustrated in FIG. 9, the second through hole 112 that penetrates the electrolytic copper plating film 172A, the electroless copper plating film 171A, the seventh insulating layer 1207, the fifth insulating layer 1205, the third insulating layer 1203, the first insulating layer 1201, the base 102, the second insulating layer 1202, the fourth insulating layer 1204, the sixth insulating layer 1206, the eighth insulating layer 1208, the electroless copper plating film 171B, and the electrolytic copper plating film 172B in the thickness direction thereof, is famed. The second through hole 112 may be formed by drilling, laser beam machining, or the like, for example. Then, a desmear process is performed on the wall defining the second through hole 112. The desmear process may be performed using a potassium permanganate solution, for example. The second through hole 112 has a diameter in a range of 350 μm to 450 μm, for example.

Figure 10:
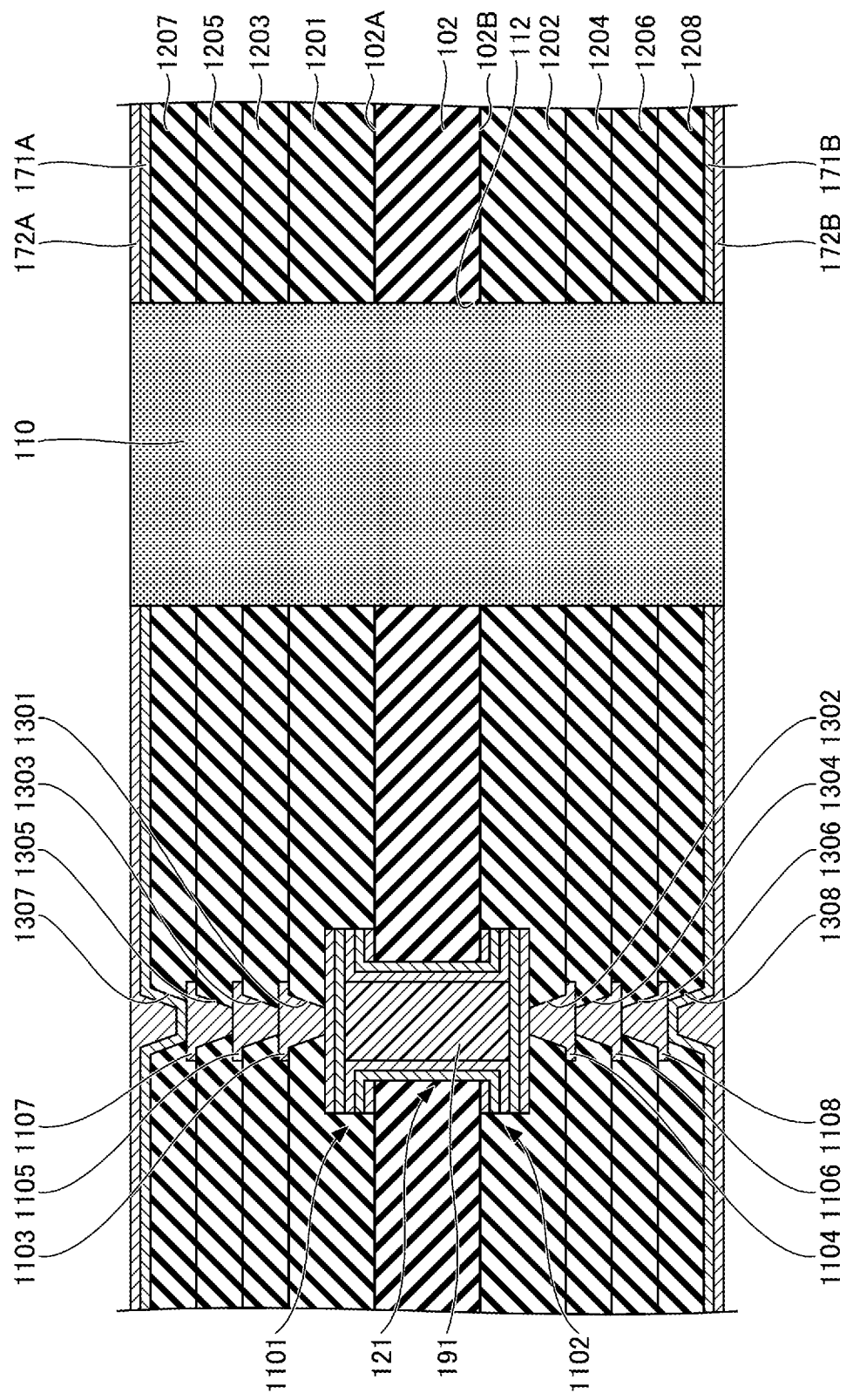
FIG. 10 is a cross sectional view (part 9) illustrating the method for manufacturing the wiring board according to the first embodiment.

Thereafter, as illustrated in FIG. 10, the magnetic material 110 is filled inside the second through hole 112. For example, the magnetic material 110 is filled to protrude from the surfaces of the electrolytic copper plating films 172A and 172B, in order to avoid insufficient filling of the second through hole 112.

Next, the portions of the magnetic material 110 protruding from the surfaces of the electrolytic copper plating films 172A and 172B are removed by polishing. For example, the protruding portions of the magnetic material 110 can be removed by buffing or roll polishing. The magnetic material 110 subjected to such polishing includes a surface that coincides with the surface of the electrolytic copper plating film 172A, and a surface that coincides with the surface of the electrolytic copper plating film 172B.

Figure 11:
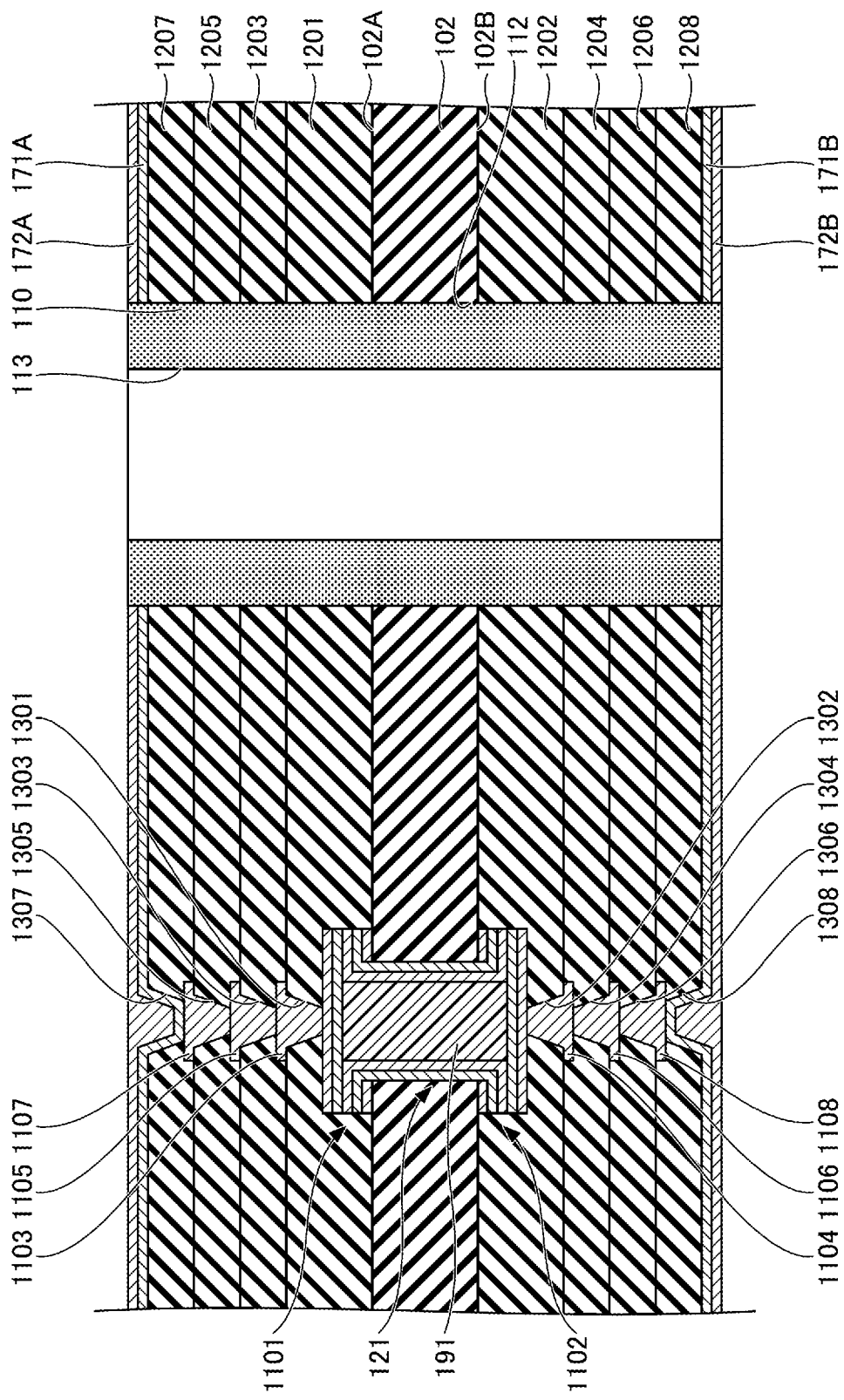
FIG. 11 is a cross sectional view (part 10) illustrating the method for manufacturing the wiring board according to the first embodiment.

Then, as illustrated in FIG. 11, the third through hole 113, that penetrates the magnetic material 110 in the thickness direction thereof, is formed in the magnetic material 110. The third through hole 113 has a diameter smaller than the diameter of the second through hole 112. The third through hole 113 may be formed by drilling, laser beam machining, or the like, for example. The third through hole 113 has a diameter in a range of 150 µm to 250 µm, for example. Thereafter, the wall defining the third through hole 113 is cleaned with water.

Figure 12:
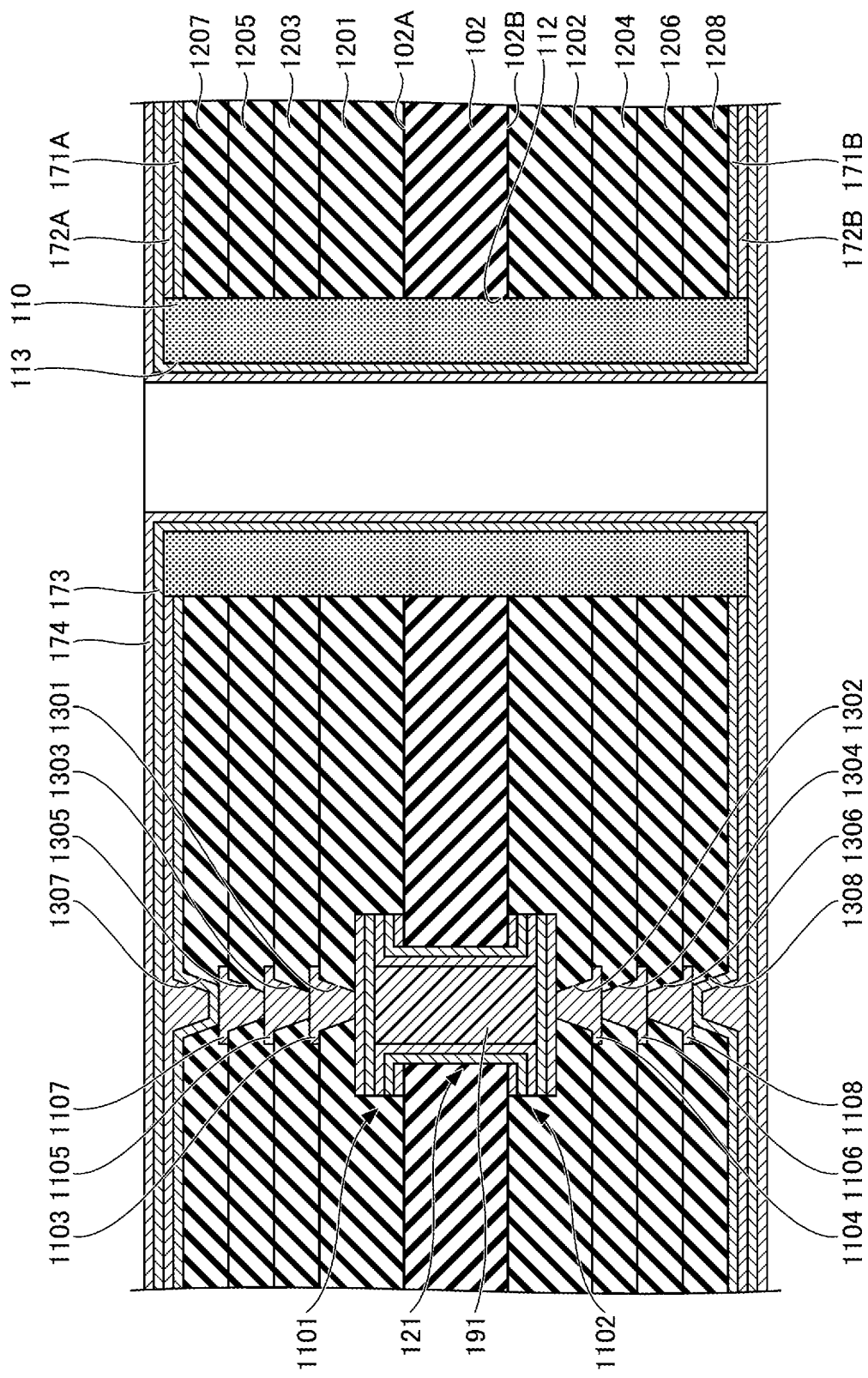
FIG. 12 is a cross sectional view (part 11) illustrating the method for manufacturing the wiring board according to the first embodiment.

Thereafter, as illustrated in FIG. 12, an electroless copper plating film 173 is formed on the surface of the electrolytic copper plating film 172A, the surface of the electrolytic copper plating film 172B, the surface of the magnetic material 110 that coincides with the surface of the electrolytic copper plating film 172A, the surface of the magnetic material 110 that coincides with the surface of the electrolytic copper plating film 172B, and the wall defining the third through hole 113. Then, an electrolytic copper plating film 174 is formed on the electroless copper plating film 173 by electrolytic plating that utilizes the electroless copper plating film 173 as a plating power feeding path. The electroless copper plating film 173 has a thickness in a range of 0.3 µm to 1.0 µm, for example, and the electrolytic copper plating film 174 has a thickness in a range of 10 µm to 50 µm, for example.

Figure 13:
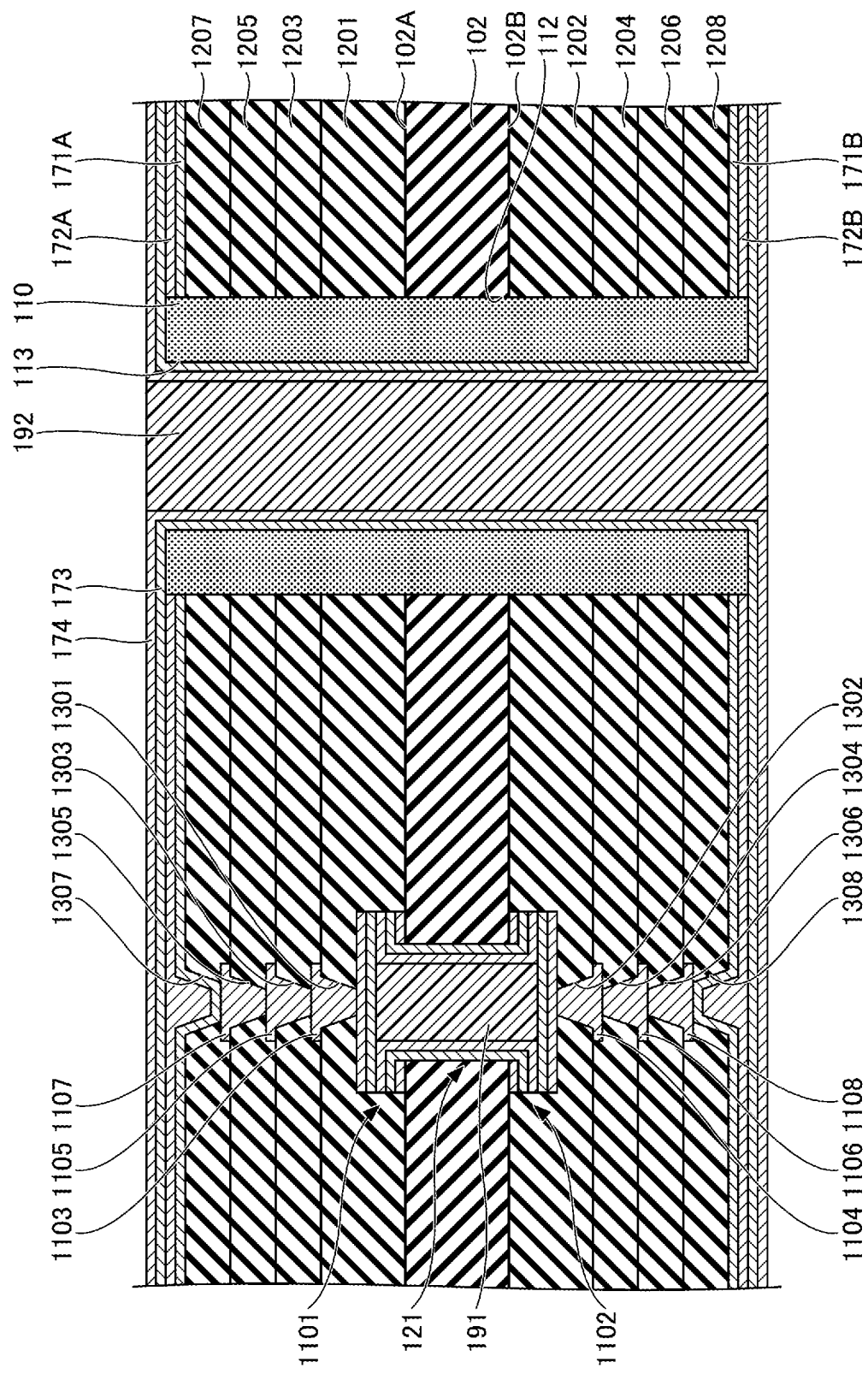
FIG. 13 is a cross sectional view (part 12) illustrating the method for manufacturing the wiring board according to the first embodiment.

Next, as illustrated in FIG. 13, the second filler material 192 is filled inside the third through hole 113. The second filler material 192 may be filled by screen printing, for example. The second filler material 192 is provided on the electrolytic copper plating film 174 inside the third through hole 113. Thereafter, the second filler material 192 is cured. In a case where the second filler material 192 includes a thermosetting resin, such as an epoxy resin or the like, the second filler material 192 can be cured by a heat treatment. The second filler material 192 is filled so as to protrude from the surfaces on both sides of the electrolytic copper plating film 174, in order to avoid insufficient filling of the second filler material 192.

Then, the second filler material 192 is polished until the surface of the electrolytic copper plating film 174 is exposed. As a result of this polishing, the second filler material 192 has a surface that coincides with the surface of the electrolytic copper plating film 174. The second filler material 192 may be polished by CMP, for example. The portion of the second filler material 192 protruding from the surface of the electrolytic copper plating film 174 may be removed by buffing or roll polishing.

Figure 14:
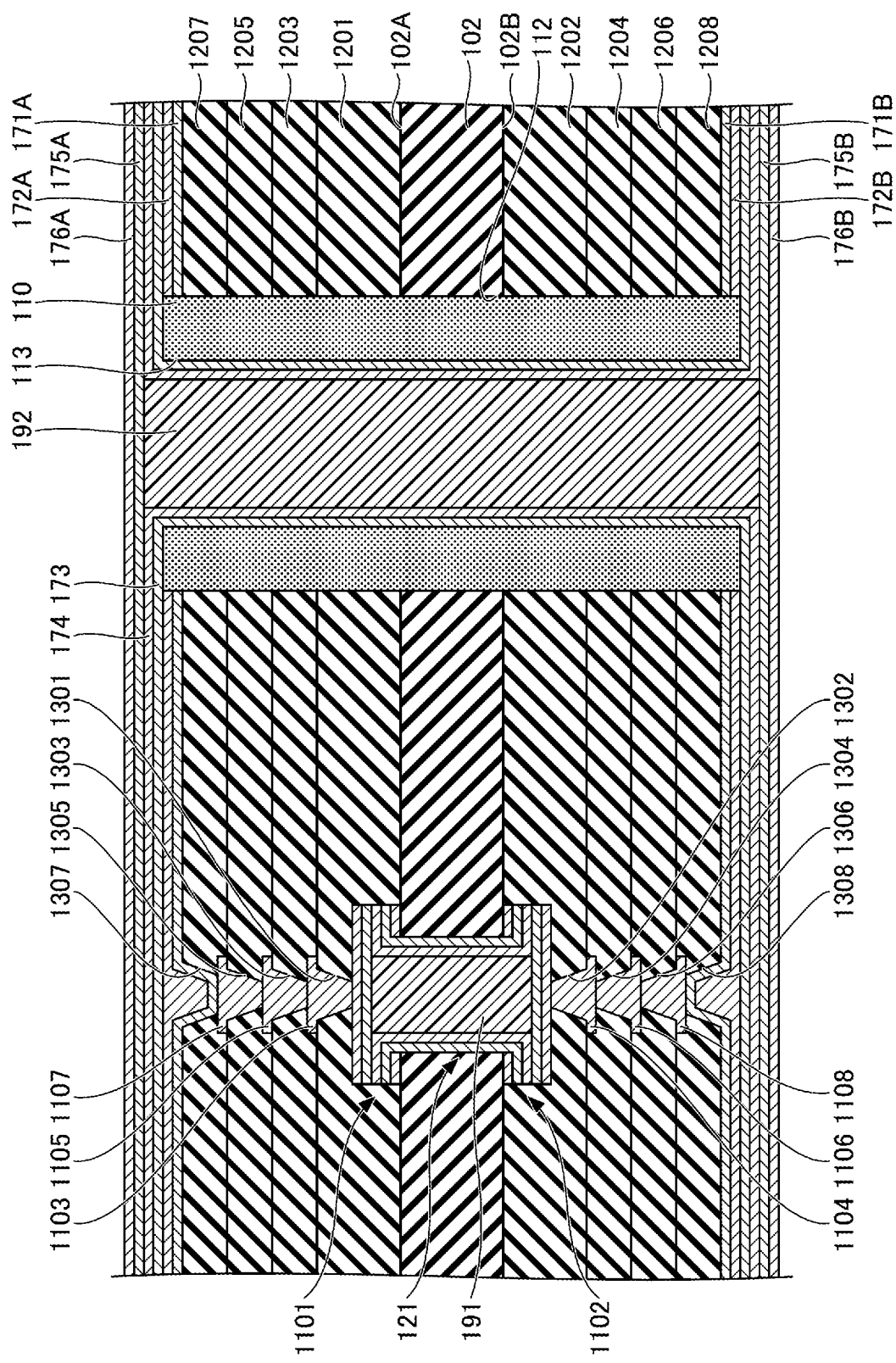
FIG. 14 is a cross sectional view (part 13) illustrating the method for manufacturing the wiring board according to the first embodiment.

Next, as illustrated in FIG. 14, an electroless copper plating film 175A is formed on the surface of the electrolytic copper plating film 174, and on the surface of the second filler material 192 that coincides with the surface of the electrolytic copper plating film 174, on the side where the first principal surface 102A is disposed. Similarly, an electroless copper plating film 175B is formed on the surface of the electrolytic copper plating film 174, and on the surface of the second filler material 192 that coincides with the surface of the electrolytic copper plating film 174, on the side where the second principal surface 102B is disposed. Thereafter, an electrolytic copper plating film 176A is formed on the electroless copper plating film 175A by electrolytic plating that utilizes the electroless copper plating film 175A as a plating power feeding path, and an electrolytic copper plating film 176B is formed on the electroless copper plating film 175B by electrolytic plating that utilizes the electroless copper plating film 175B as a plating power feeding path. The electroless copper plating films 175A and 175B have a thickness in a range of 0.3 µm to 1.0 µm, for example, and the electrolytic copper plating films 176A and 176B have a thickness in a range of 15 µm to 40 µm, for example.

Figure 15:
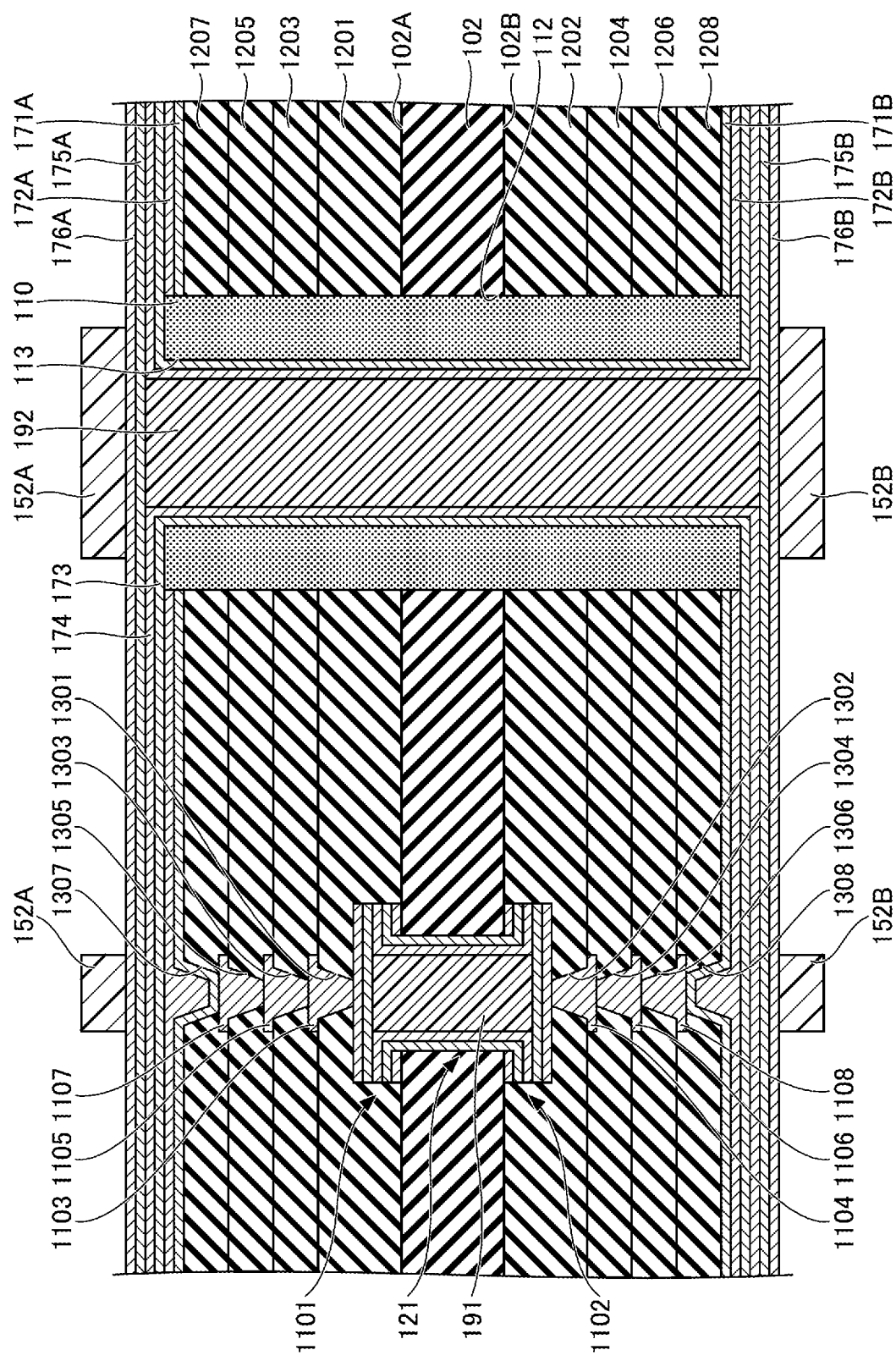
FIG. 15 is a cross sectional view (part 14) illustrating the method for manufacturing the wiring board according to the first embodiment.

Then, as illustrated in FIG. 15, a resist layer 152A having a pattern of the ninth interconnect layer 1109 is formed on the electrolytic copper plating film 176A, and a resist layer 152B having a pattern of the tenth interconnect layer 1110 is formed on the electrolytic copper plating film 176B. The resist layers 152A and 152B may be dry films or the like, for example, and the patterns may be famed in the resist layers 152A and 152B by exposing and developing processes.

Figure 16:
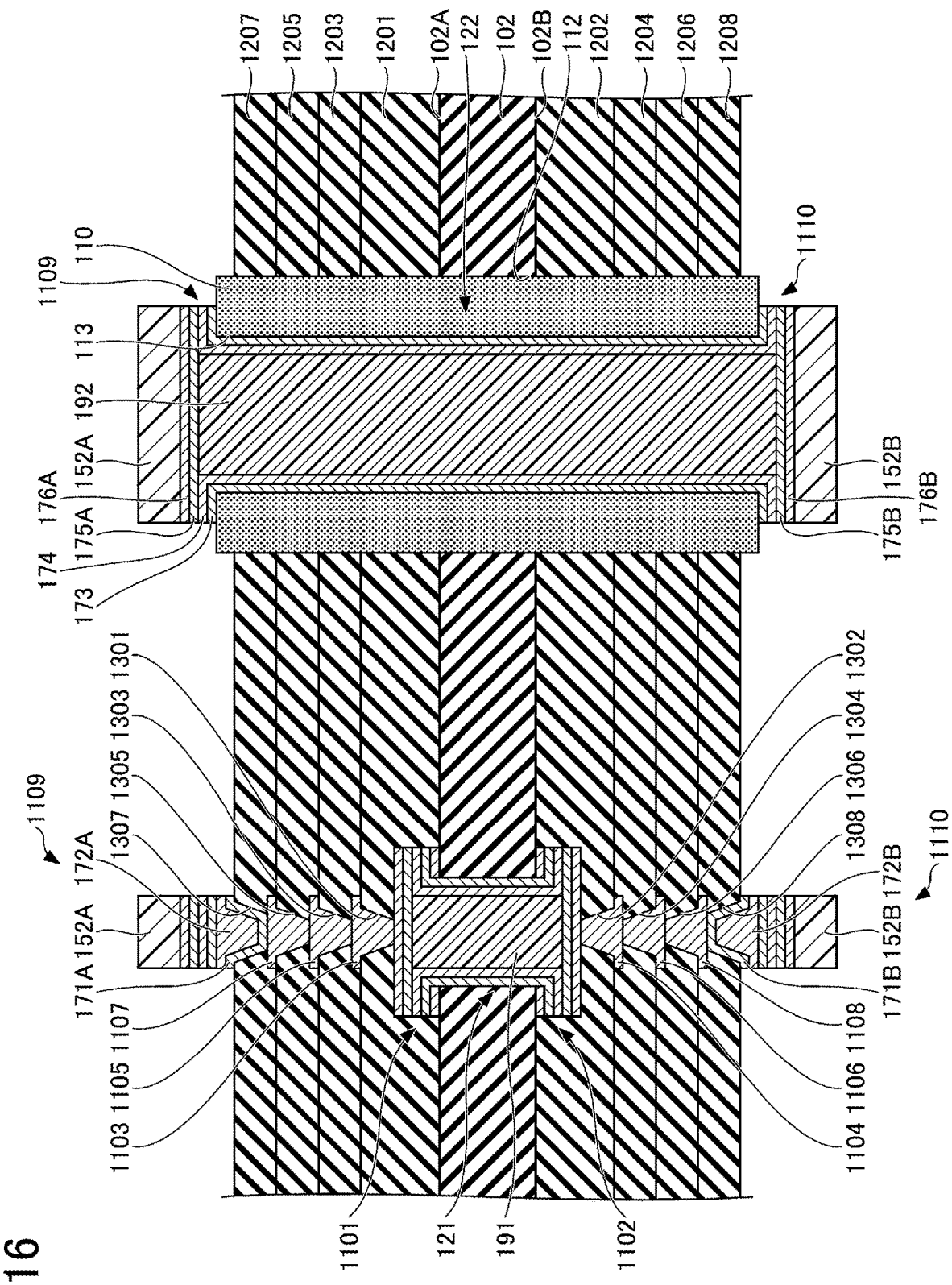
FIG. 16 is a cross sectional view (part 15) illustrating the method for manufacturing the wiring board according to the first embodiment.

Next, as illustrated in FIG. 16, the resist layer 152A is used as a mask, to etch the electrolytic copper plating film 176A, the electroless copper plating film 175A, the electrolytic copper plating film 174, the electroless copper plating film 173, the electrolytic copper plating film 172A, and the electroless copper plating film 171A. Similarly, the resist layer 152B is used as a mask, to etch the electrolytic copper plating film 176B, the electroless copper plating film 175B, the electrolytic copper plating film 174, the electroless copper plating film 173, the electrolytic copper plating film 172B, and the electroless copper plating film 171B.

As a result, the second penetrating conductive via 122, the ninth interconnect layer 1109, and the tenth interconnect layer 1110 are obtained. The second penetrating conductive via 122 includes portions of the electroless copper plating film 173 and electrolytic copper plating film 174 between the surfaces on both sides of the magnetic material 110. The ninth interconnect layer 1109 includes the electroless copper plating film 171A, the electrolytic copper plating film 172A, portions of the electroless copper plating film 173 and the electrolytic copper plating film 174 closer to the electroless copper plating film 175A than to the surface of the magnetic material 110 on the side where the first principal surface 102A is disposed, the electroless copper plating film 175A, and the electrolytic copper plating film 176A. The tenth interconnect layer 1110 includes the electroless copper plating film 171B, the electrolytic copper plating film 172B, portions of the electroless copper plating film 173 and the electrolytic copper plating film 174 closer to the electroless copper plating film 175B than to the surface of the magnetic material 110 on the side where the second principal surface 102B is disposed, the electroless copper plating film 175B, and the electrolytic copper plating film 176B. A portion of the ninth interconnect layer 1109 does not need to include the electroless copper plating film 171A and the electrolytic copper plating film 172A. A portion of the tenth interconnect layer 1110 does not need to include the electroless copper plating film 171B and the electrolytic copper plating film 172B.

Figure 17:
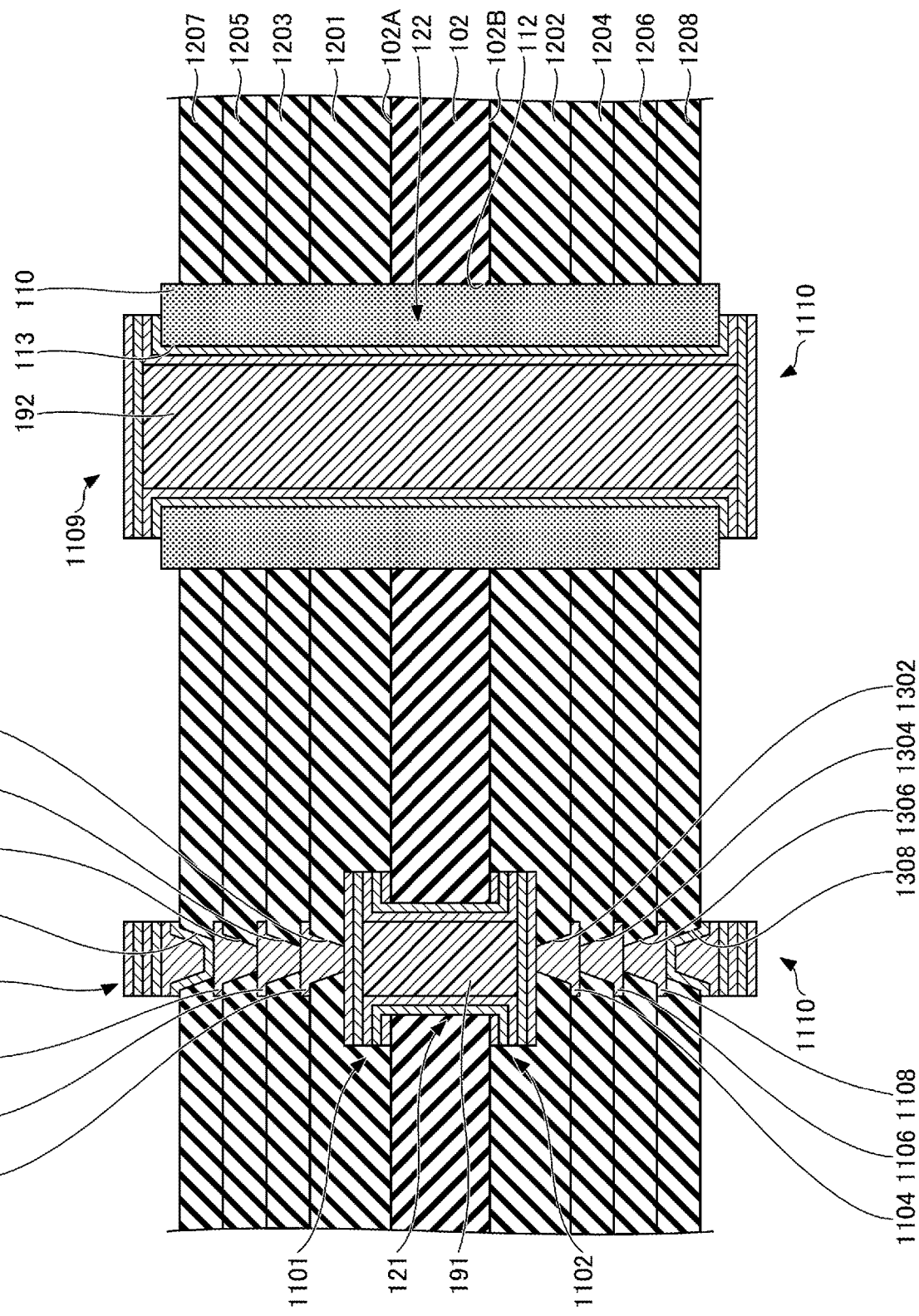
FIG. 17 is a cross sectional view (part 16) illustrating the method for manufacturing the wiring board according to the first embodiment.

Then, as illustrated in FIG. 17, the resist layers 152A and 152B are removed.

Figure 18:
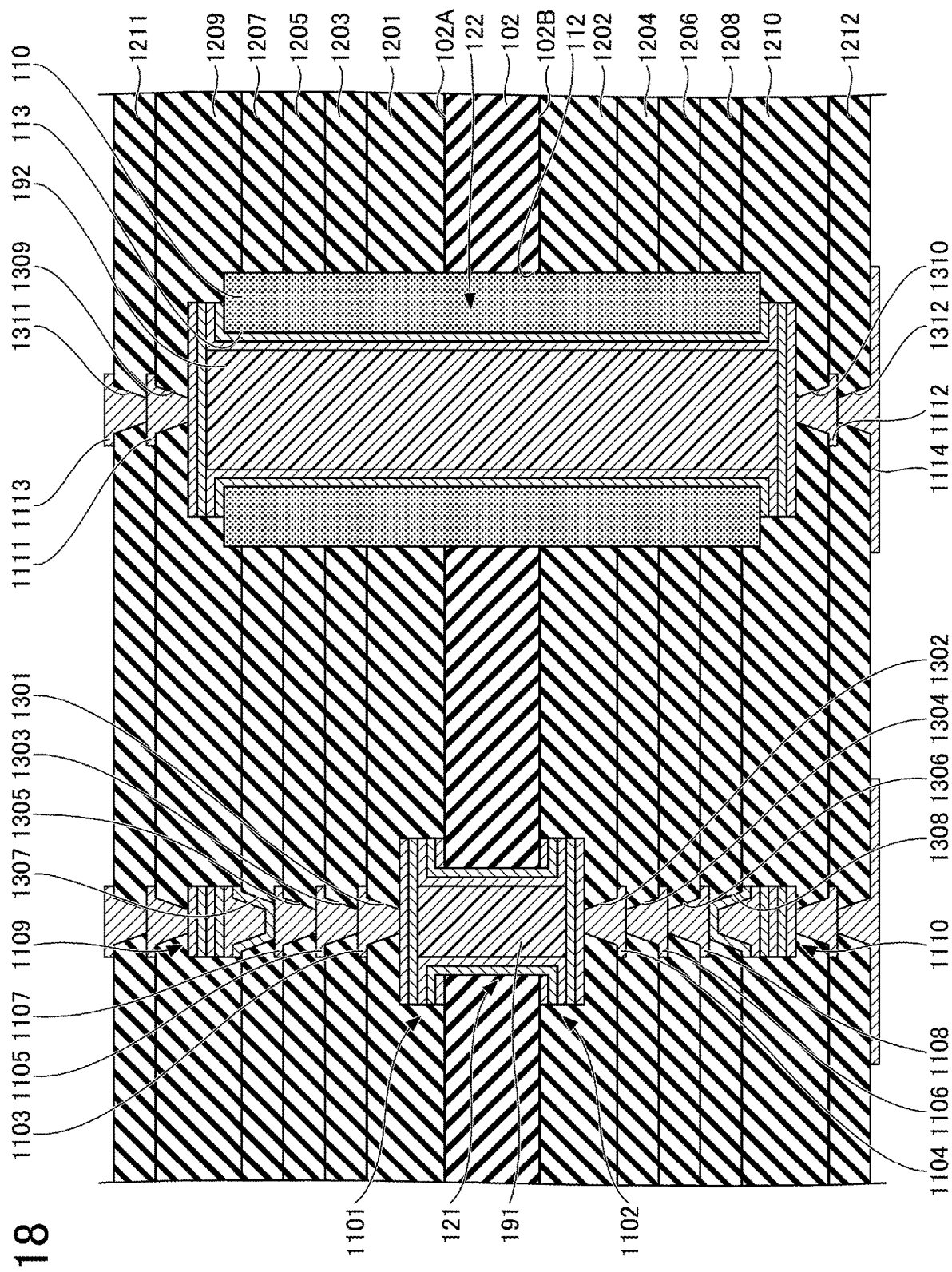
FIG. 18 is a cross sectional view (part 17) illustrating the method for manufacturing the wiring board according to the first embodiment.

Next, as illustrated in FIG. 18, the ninth insulating layer 1209 is formed on the seventh insulating layer 1207, so as to cover the ninth interconnect layer 1109. The tenth insulating layer 1210 is formed on the eighth insulating layer 1208, so as to cover the tenth interconnect layer 1110. The ninth insulating layer 1209 and the tenth insulating layer 1210 can be formed in a manner similar to the first insulating layer 1201 and the second insulating layer 1202. Then, the via hole 1309, that reaches the connecting portion of the ninth interconnect layer 1109, is formed in the ninth insulating layer 1209, by performing laser beam machining with respect to the ninth insulating layer 1209. In addition, the via hole 1310, that reaches the connecting portion of the tenth interconnect layer 1110, is formed in the tenth insulating layer 1210, by performing laser beam machining with respect to the tenth insulating layer 1210. The via hole 1309 and the via hole 1310 can be formed in a manner similar to the via hole 1301 and via hole 1302.

Next, as also illustrated in FIG. 18, the eleventh interconnect layer 1111, that is connected to the ninth interconnect layer 1109 through the via conductor inside the via hole 1309, is formed on the ninth insulating layer 1209, and the twelfth interconnect layer 1112, that is connected to the tenth interconnect layer 1110 through the via conductor inside the via hole 1310, is famed on the tenth insulating layer 1210. The eleventh interconnect layer 1111 and the twelfth interconnect layer 1112 can be formed in a manner similar to the third interconnect layer 1103 and the fourth interconnect layer 1104.

Next, as illustrated in FIG. 18, the eleventh insulating layer 1211 is formed on the ninth insulating layer 1209, so as to cover the eleventh interconnect layer 1111. In addition, the twelfth insulating layer 1212 is formed on the tenth insulating layer 1210, so as to cover the twelfth interconnect layer 1112. The eleventh insulating layer 1211 and the twelfth insulating layer 1212 can be formed in a manner similar to the first insulating layer 1201 and the second insulating layer 1202. Then, the via hole 1311, that reaches the connecting portion of the eleventh interconnect layer 1111, is formed in the eleventh insulating layer 1211, by performing laser beam machining with respect to the eleventh insulating layer 1211. Moreover, the via hole 1312, that reaches the connecting portion of the twelfth interconnect layer 1112, is famed in the twelfth insulating layer 1212, by performing laser beam machining with respect to the twelfth insulating layer 1212. The via hole 1311 and the via hole 1312 can be formed in a manner similar to the via hole 1301 and the via hole 1302.

Further, as also illustrated in FIG. 18, the thirteenth interconnect layer 1113, that is connected to the eleventh interconnect layer 1111 through the via conductor inside the via hole 1311, is formed on the eleventh insulating layer 1211, and the fourteenth interconnect layer 1114, that is connected to the twelfth interconnect layer 1112 through the via conductor inside the via hole 1312, is famed on the twelfth insulating layer 1212. The thirteenth interconnect layer 1113 and the fourteenth interconnect layer 1114 can be formed in a manner similar to the third interconnect layer 1103 and the fourth interconnect layer 1104.

Figure 19:
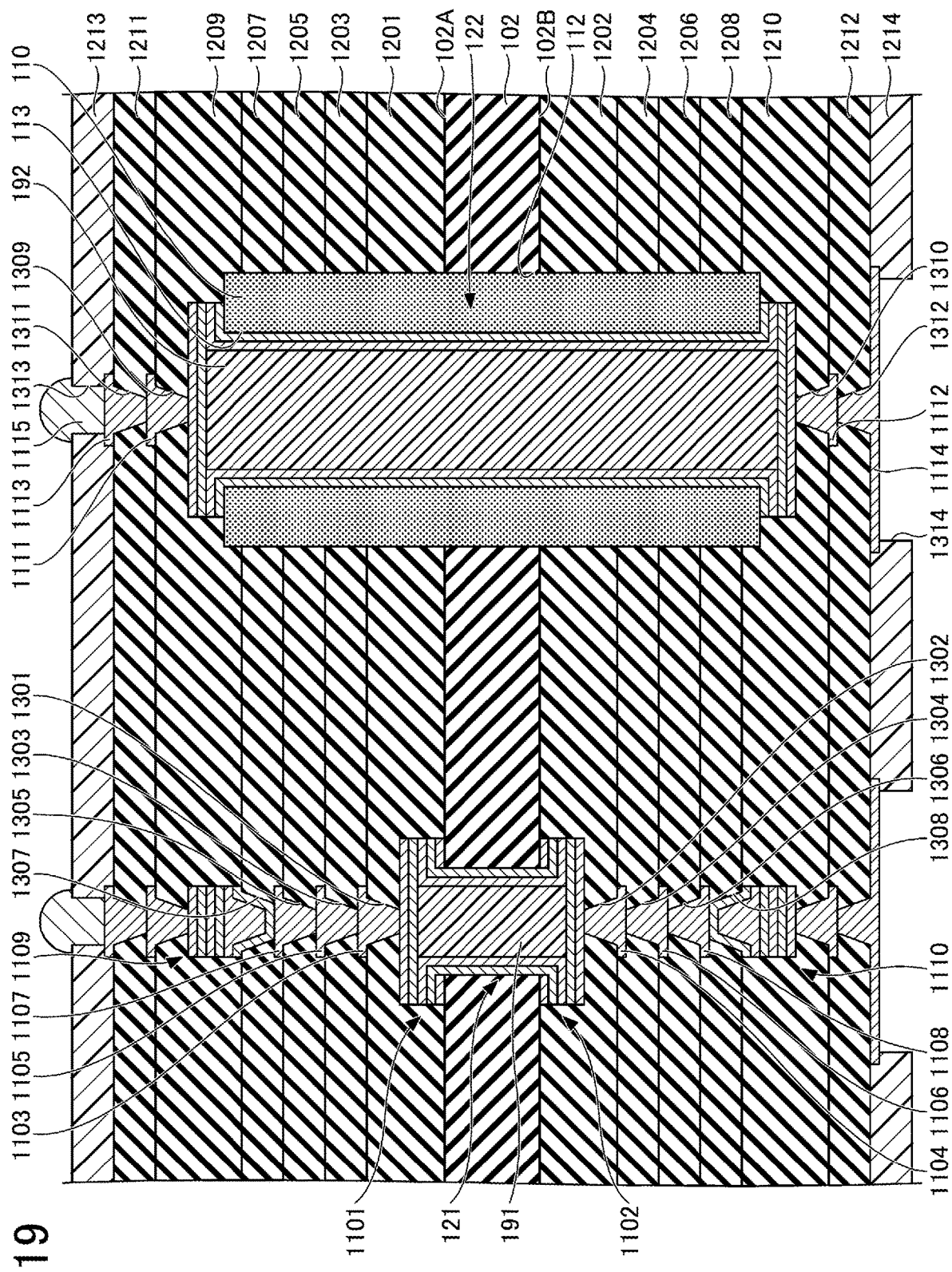
FIG. 19 is a cross sectional view (part 18) illustrating the method for manufacturing the wiring board according to the first embodiment.

Next, as illustrated in FIG. 19, the solder resist layer 1213 is formed on the eleventh insulating layer 1211, and the solder resist layer 1214 is formed on the twelfth insulating layer 1212. Thereafter, the opening 1313, that reaches the connecting portion of the thirteenth interconnect layer 1113, is formed in the solder resist layer 1213, and the opening 1314, that reaches the connecting portion of the fourteenth interconnect layer 1114, is formed in the solder resist layer 1214.

The solder resist layers 1213 and 1214 are formed of an insulating resin, such as photosensitive epoxy resins, acrylic resins, or the like. The solder resist layers 1213 and 1214 may be formed by adhering a resin film or coating a liquid resin. The openings 1313 and 1314 can be famed by exposing and developing processes. An insulating resin, such as non-photosensitive epoxy resins, polyimide resins, or the like may be used for the solder resist layers 1213 and 1214. In this case, the openings 1313 and 1314 can be formed by laser beam machining or blasting.

Next, the connection terminal 1115, that protrudes above the solder resist layer 1213 through the opening 1313, is formed on the connecting portion of the thirteenth interconnect layer 1113. The connection terminal 1115 may include a post and a bumps on the post.

Next, the structure that is obtained by the processes up to the forming of the connection terminal 1115, is cut along a predetermined cutting line, by a slicer or the like. Hence, the structure is singulated into structures corresponding to the wiring board 100, and a plurality of wiring boards 100 according to the first embodiment is obtained from the large laminate 101. Accordingly, it is possible to manufacture the wiring board 100 according to the first embodiment.

In the first embodiment, the second through hole 112 is formed not only in the base 102, but also in the first insulating layer 1201, the second insulating layer 1202, the third insulating layer 1203, the fourth insulating layer 1204, the fifth insulating layer 1205, the sixth insulating layer 1206, the seventh insulating layer 1207, and the eighth insulating layer 1208, and the magnetic material 110 is provided inside the second through hole 112. Further, the third through hole 113 is formed in the magnetic material 110, and the second penetrating conductive via 122 is provided inside the third through hole 113. Accordingly, the interconnect including the second penetrating conductive via 122 can have a high inductance, without having to the use a thick base 102.

In addition, the first through hole 111 is formed in the base 102, and the first penetrating conductive via 121 is provided inside the first through hole 111. Accordingly, the interconnect that do not require a high inductance can include the first penetrating conductive via 121. Moreover, when forming the first through hole 111, it is not necessary to perform processes with respect to the first insulating layer 1201, the second insulating layer 1202, the third insulating layer 1203, the fourth insulating layer 1204, the fifth insulating layer 1205, the sixth insulating layer 1206, the seventh insulating layer 1207, and the eighth insulating layer 1208.

As described above, in the first embodiment, even without using a thick base 102, a high inductance can be secured in a desired interconnect, and unnecessary processes can be omitted for an interconnect that does not require a high inductance. Accordingly, it is possible to reduce deterioration in the production efficiency, while securing a high inductance in the desired wiring.

In addition, because the first through hole 111 is not formed in the first insulating layer 1201, the second insulating layer 1202, the third insulating layer 1203, the fourth insulating layer 1204, the fifth insulating layer 1205, the sixth insulating layer 1206, the seventh insulating layer 1207, and the eighth insulating layer 1208, it is possible to improve a freedom of design of the third interconnect layer 1103, the fourth interconnect layer 1104, the fifth interconnect layer 1105, the sixth interconnect layer 1106, the seventh interconnect layer 1107, and the eighth interconnect layer 1108.

Moreover, a total thickness of the wiring board 100 can be reduced, or a time required to form the first through hole 111, can be reduced by using the thin base 102.

Second Embodiment

Next, a second embodiment will be described. The second embodiment differs from the first embodiment mainly in the configurations of the ninth interconnect layer 1109, the tenth interconnect layer 1110, and the second penetrating conductive via 122.

Configuration of Wiring Board

Figure 20:
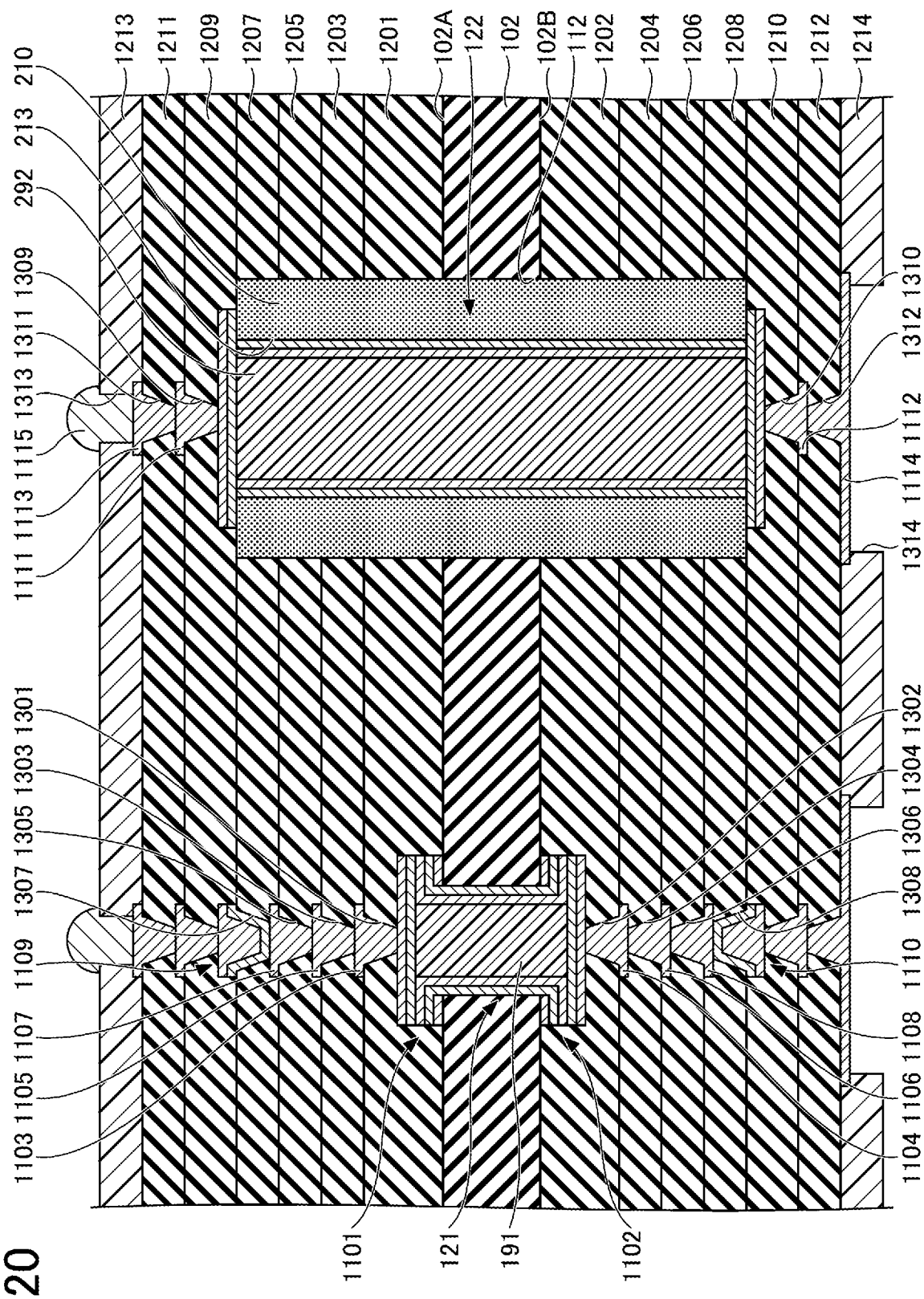
FIG. 20 is a cross sectional view illustrating a structure of the wiring board according to a second embodiment.

First, the configuration of the wiring board will be described. FIG. 20 is a cross sectional view illustrating the configuration of the wiring board according to the second embodiment. FIG. 20 illustrates, in detail, the region R in FIG. 1, similar to FIG. 2A through FIG. 19.

In the wiring board according to the second embodiment, a magnetic material 210 is provided in place of the magnetic material 110, and a third through hole 213 is famed in the magnetic material 210. The second penetrating conductive via 122 includes an electroless copper plating film 273 and an electrolytic copper plating film 274 in place of the electroless copper plating film 173 and an electrolytic copper plating film 174, respectively, and includes a second filler material 292 in place of the second filler material 192. The magnetic material 210, the electroless copper plating film 273, the electrolytic copper plating film 274, and the second filler material 292 have surfaces that coincide with the surface of the seventh insulating layer 1207, and surfaces that coincide with the surface of the eighth insulating layer 1208.

The ninth interconnect layer 1109 includes an electroless copper plating film 271A and an electrolytic copper plating film 272A in place of the electroless copper plating film 171A, the electrolytic copper plating film 172A, the electroless copper plating film 173, the electrolytic copper plating film 174, an electroless copper plating film 175A, and the electrolytic copper plating film 176A. The tenth interconnect layer 1110 includes an electroless copper plating film 271B and an electrolytic copper plating film 272B in place of the electroless copper plating film 171B, the electrolytic copper plating film 172B, the electroless copper plating film 173, the electrolytic copper plating film 174, the electroless copper plating film 175B, and the electrolytic copper plating film 176B.

Other configurations are similar to those of the first embodiment.

Method For Manufacturing Wiring Board

Next, the method for manufacturing the wiring board according to the second embodiment will be described. FIG. 21 through FIG. 33 are cross sectional views illustrating the method for manufacturing the wiring board according to the second embodiment. FIG. 21 through FIG. 33 illustrate, in detail, the region R in FIG. 1, similar to FIG. 2A through FIG. 19.

Figure 21:
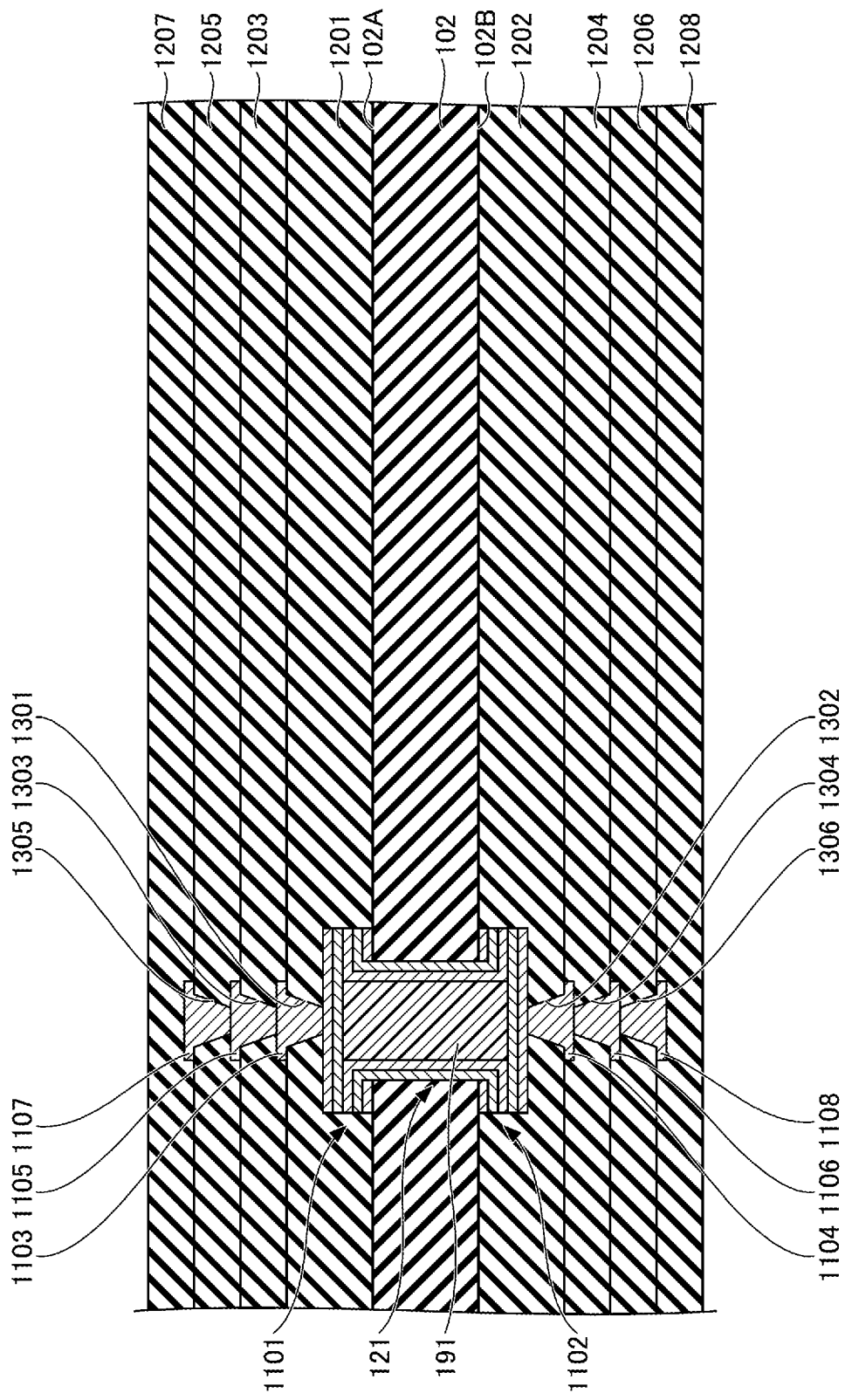
FIG. 21 is a cross sectional view (part 1) illustrating a method for manufacturing the wiring board according to the second embodiment.

First, as illustrated in FIG. 21, the processes up to the forming of the seventh insulating layer 1207 and the eighth insulating layer 1208 are performed, similar to the first embodiment.

Figure 22:
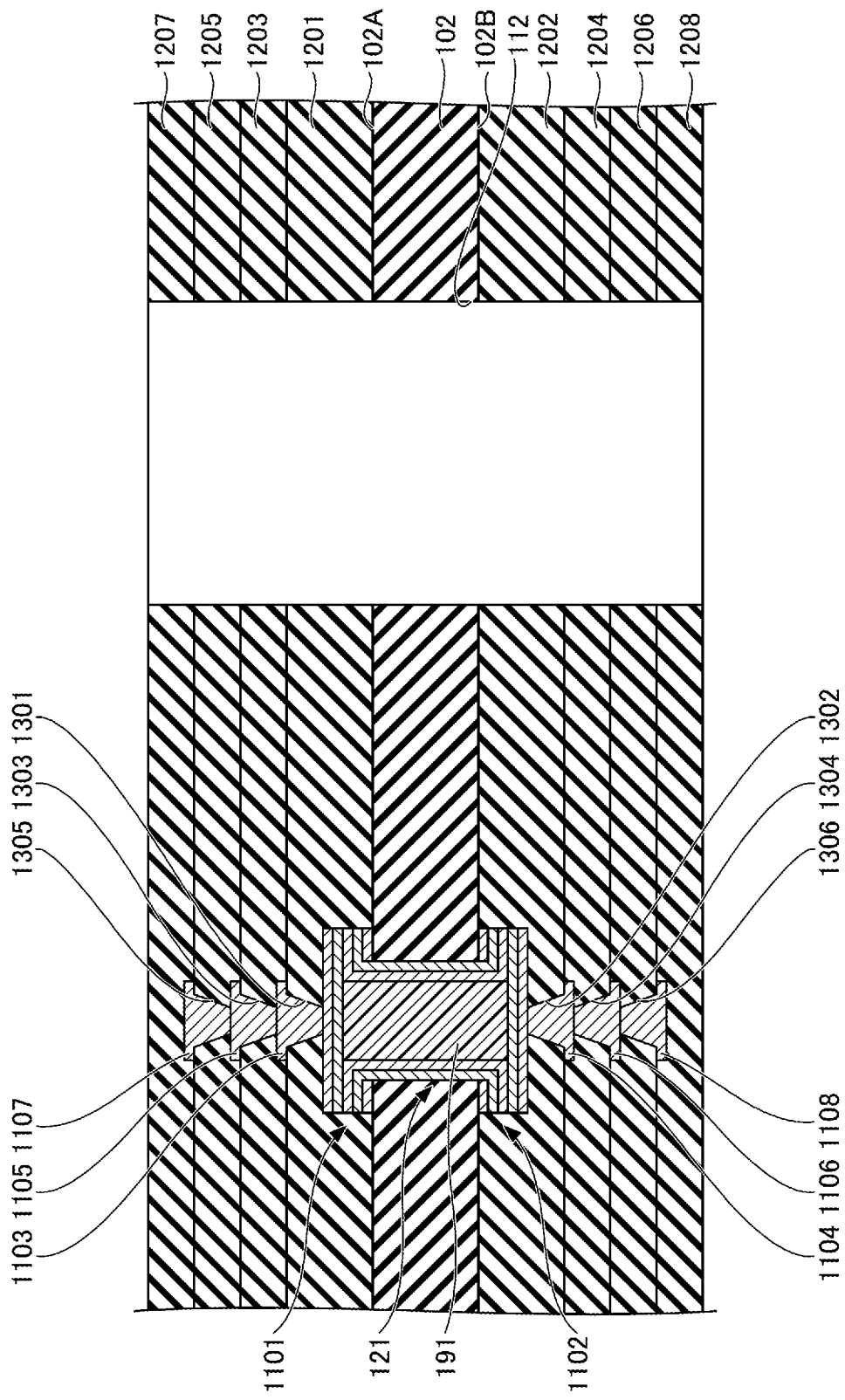
FIG. 22 is a cross sectional view (part 2) illustrating the method for manufacturing the wiring board according to the second embodiment.

Then, as illustrated in FIG. 22, the second through hole 112 that penetrates the seventh insulating layer 1207, the fifth insulating layer 1205, the third insulating layer 1203, the first insulating layer 1201, the base 102, the second insulating layer 1202, the fourth insulating layer 1204, the sixth insulating layer 1206, and the eighth insulating layer 1208 in a thickness direction thereof, is famed. Next, a desmear process is performed on the wall defining the second through hole 112.

Figure 23:
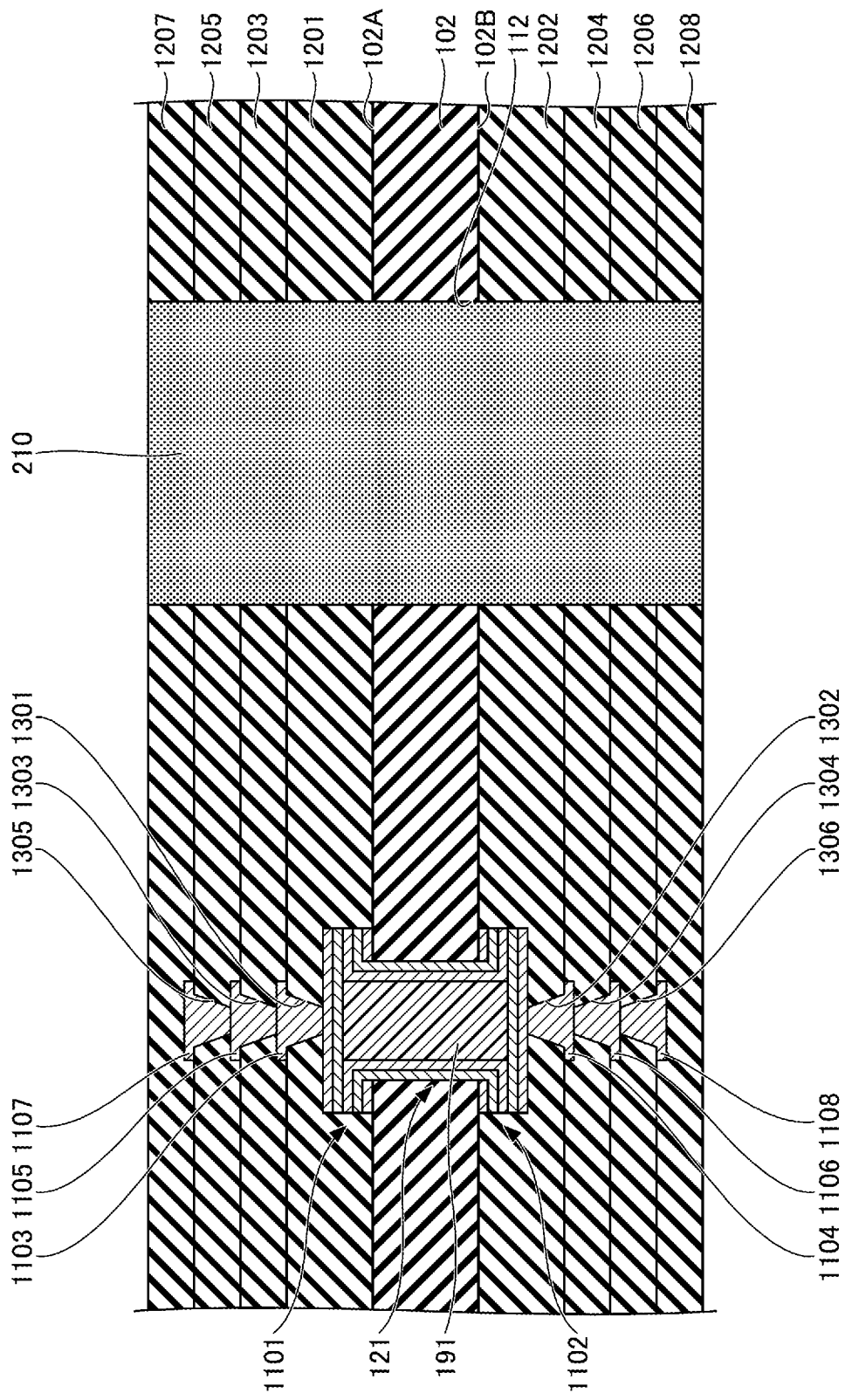
FIG. 23 is a cross sectional view (part 3) illustrating the method for manufacturing the wiring board according to the second embodiment.

Thereafter, as illustrated in FIG. 23, the magnetic material 210 is filled inside the second through hole 112. For example, the magnetic material 210 is filled so as to protrude from the surfaces of the seventh insulating layer 1207 and the eighth insulating layer 1208, in order to avoid insufficient filling of the magnetic material 210.

Next, the portions of the magnetic material 210 protruding from the surfaces of the seventh insulating layer 1207 and the eighth insulating layer 1208 are removed by polishing. For example, the protruding portions of the magnetic material 210 can be removed by buffing or roll polishing. The magnetic material 210 subjected to such polishing includes a surface that coincides with the surface of the seventh insulating layer 1207, and a surface that coincides with the surface of the eighth insulating layer 1208.

Figure 24:
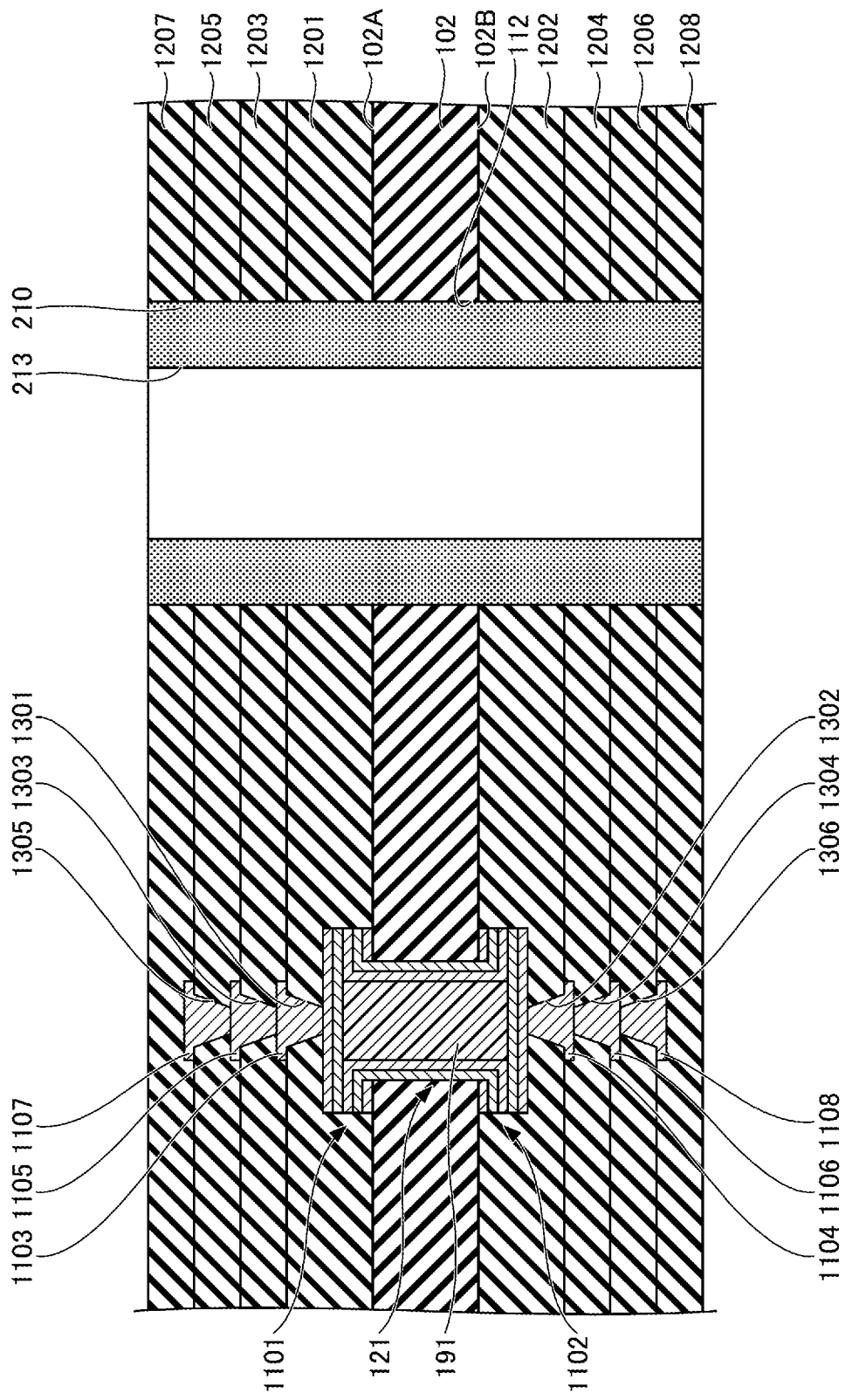
FIG. 24 is a cross sectional view (part 4) illustrating the method for manufacturing the wiring board according to the second embodiment.

Next, as illustrated in FIG. 24, the third through hole 213, that penetrates the magnetic material 210 in a thickness direction thereof, is formed in the magnetic material 210. The third through hole 213 may be formed by drilling, laser beam machining, or the like, for example. The third through hole 213 has a diameter in a range of 150 μm to 250 μm, for example. Then, the wall defining the third through hole 213 is cleaned with water.

Figure 25:
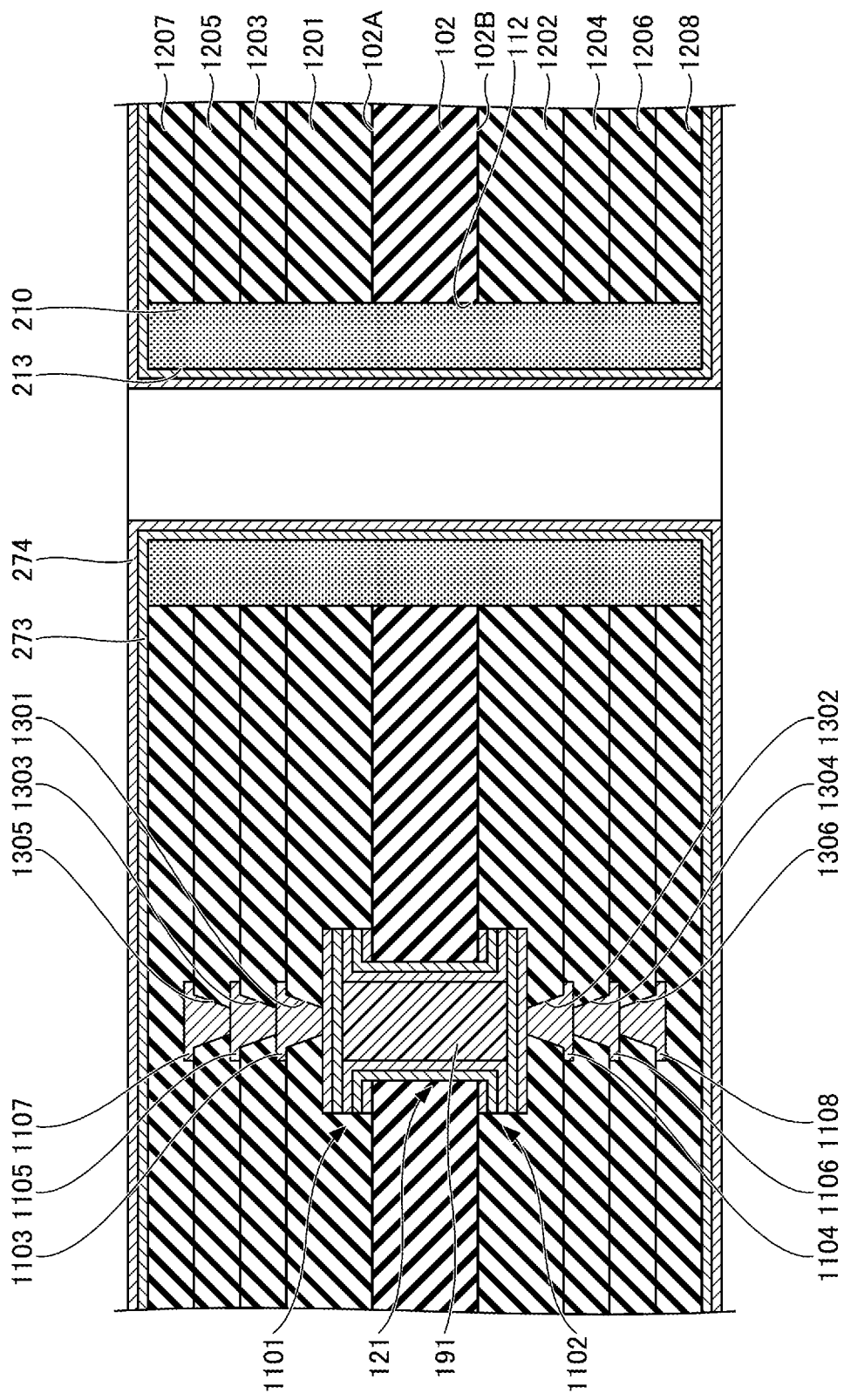
FIG. 25 is a cross sectional view (part 5) illustrating the method for manufacturing the wiring board according to the second embodiment.

Thereafter, as illustrated in FIG. 25, the electroless copper plating film 273 is formed on the surface of the seventh insulating layer 1207, the surface of the eighth insulating layer 1208, the surface of the magnetic material 210 that coincides with the surface of the seventh insulating layer 1207, the surface of the magnetic material 210 that coincides with the surface of the eighth insulating layer 1208, and the wall defining the third through hole 213. Next, the electrolytic copper plating film 274 is formed on the electroless copper plating film 273 by electrolytic plating that utilizes the electroless copper plating film 273 as a plating power feeding path. The electroless copper plating film 273 has a thickness in a range of 0.3 μm to 1.0 μm, for example, and the electrolytic copper plating film 274 has a thickness in a range of 10 μm to 50 μm, for example.

Figure 26:
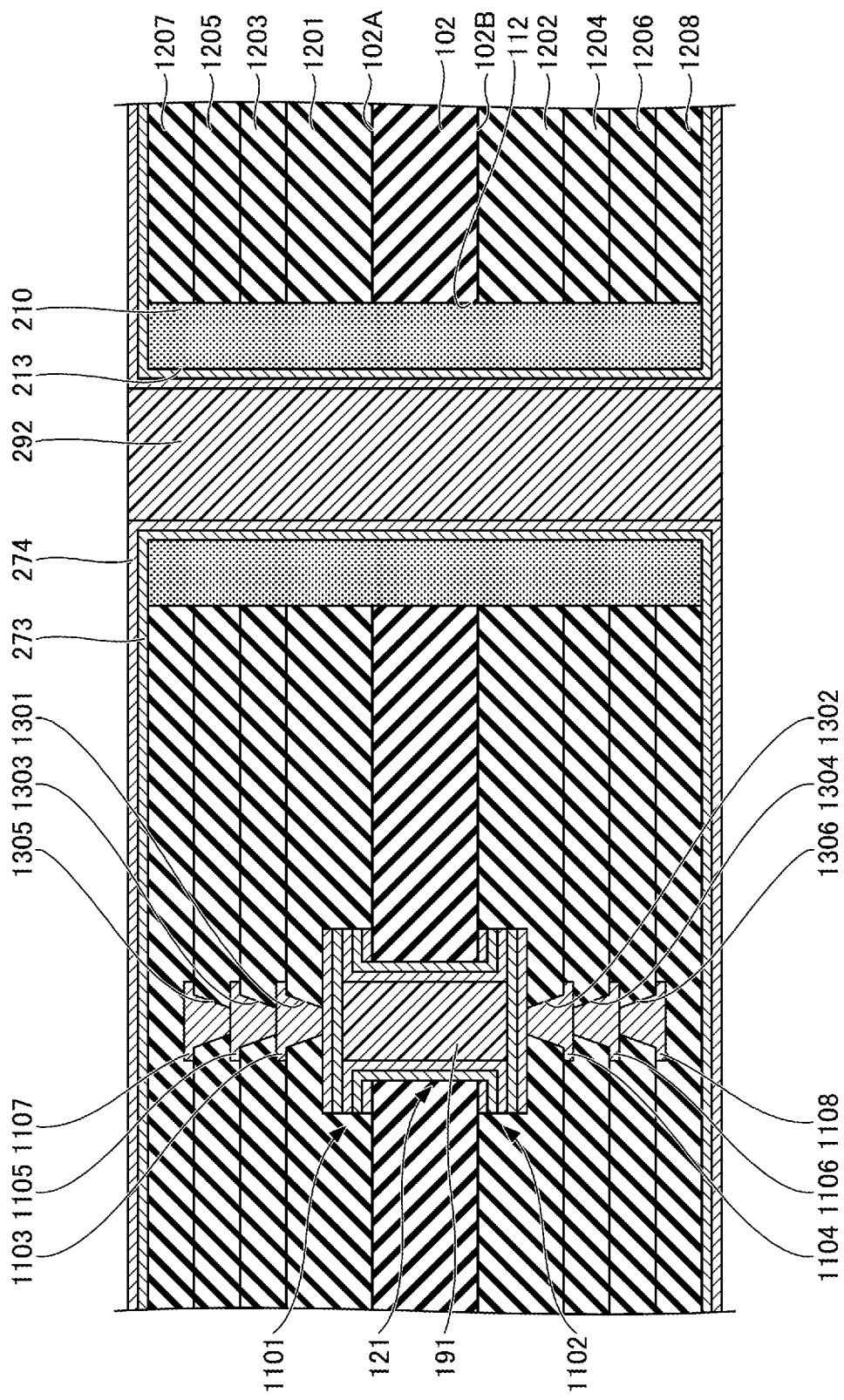
FIG. 26 is a cross sectional view (part 6) illustrating the method for manufacturing the wiring board according to the second embodiment.

Next, as illustrated in FIG. 26, the second filler material 292 is filled inside the third through hole 213. The second filler material 292 may be filled by screen printing, for example. The second filler material 292 is provided on the electrolytic copper plating film 274 inside the third through hole 213. Thereafter, the second filler material 292 is cured. In a case where the second filler material 292 includes a thermosetting resin, such as an epoxy resin or the like, the second filler material 292 can be cured by a heat treatment. The second filler material 292 is filled so as to protrude from the surfaces on both sides of the electrolytic copper plating film 274, in order to avoid insufficient filling of the second filler material 292.

Figure 27:
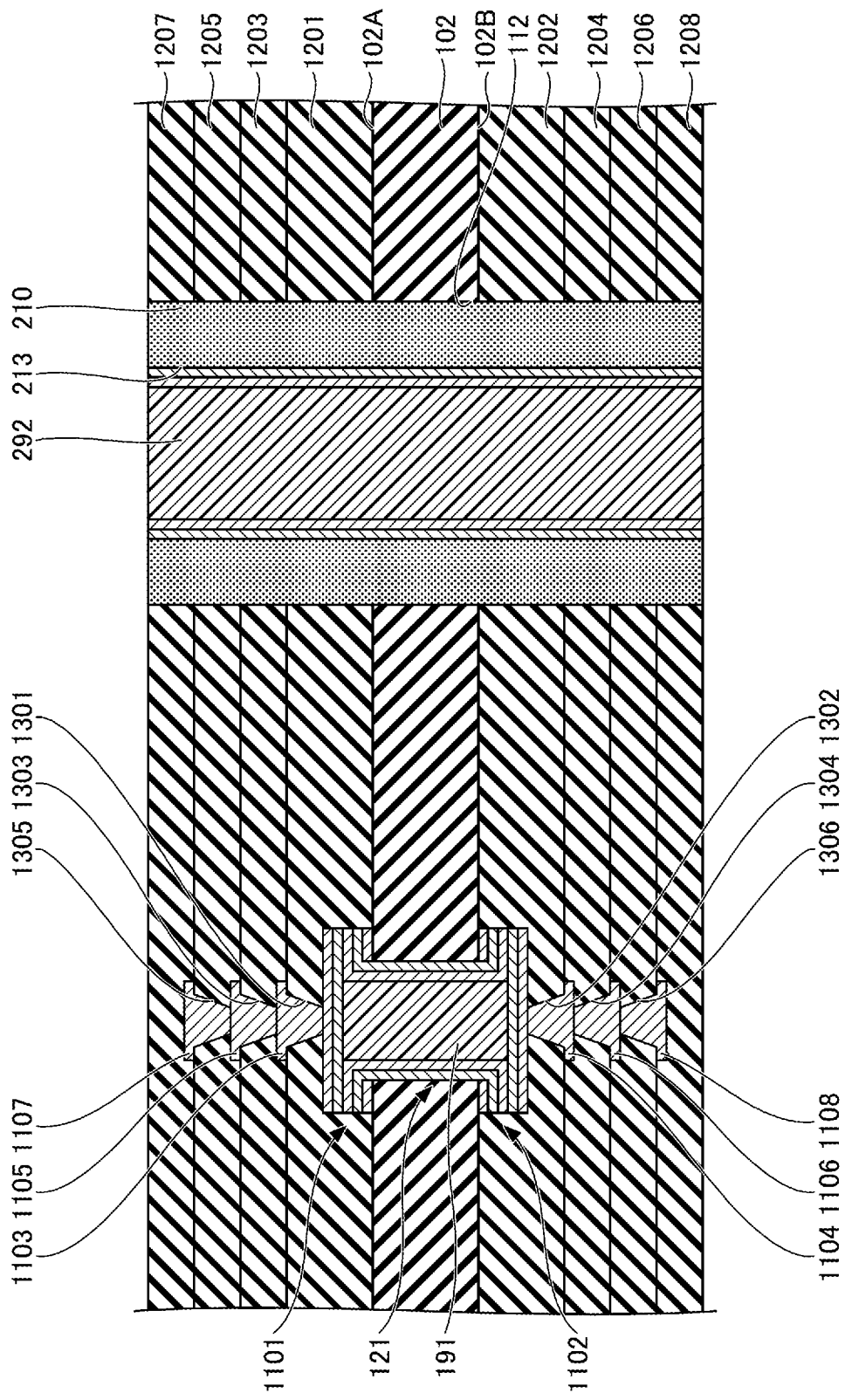
FIG. 27 is a cross sectional view (part 7) illustrating the method for manufacturing the wiring board according to the second embodiment.

Next, as illustrated in FIG. 27, the electrolytic copper plating film 274, the electroless copper plating film 273, and the second filler material 292 are polished until the surface of the seventh insulating layer 1207 is exposed, on the side where the first principal surface 102A is disposed. In addition, the electrolytic copper plating film 274, the electroless copper plating film 273, and the second filler material 292 are polished until the surface of the eighth insulating layer 1208 is exposed, on the side where the second principal surface 102B is disposed. As a result of this polishing, the electroless copper plating film 273, the electrolytic copper plating film 274, and the second filler material 292 have surfaces that coincide with the surface of the seventh insulating layer 1207 and the surface of the eighth insulating layer 1208. The electroless copper plating film 273, the electrolytic copper plating film 274, and the second filler material 292 may be polished by the CMP, for example. The electrolytic copper plating film 274, the electroless copper plating film 273, and the second filler material 292 may be polished as follows. First, the portions of the electrolytic copper plating film 274 and the electroless copper plating film 273 at the surface of the seventh insulating layer 1207, and the portion of the electrolytic copper plating film 274 and the electroless copper plating film 273 at the surface of the eighth insulating layer 1208, are removed by wet etching. As a result of this wet etching, the surface of the seventh insulating layer 1207 and the surface of the eighth insulating layer 1208 are exposed. Then, the portion of the second filler material 292 protruding from the surface of the seventh insulating layer 1207, and the portion of the second filler material 292 protruding from the surface of the eighth insulating layer 1208, are removed by buffing or roll polishing.

Figure 28:
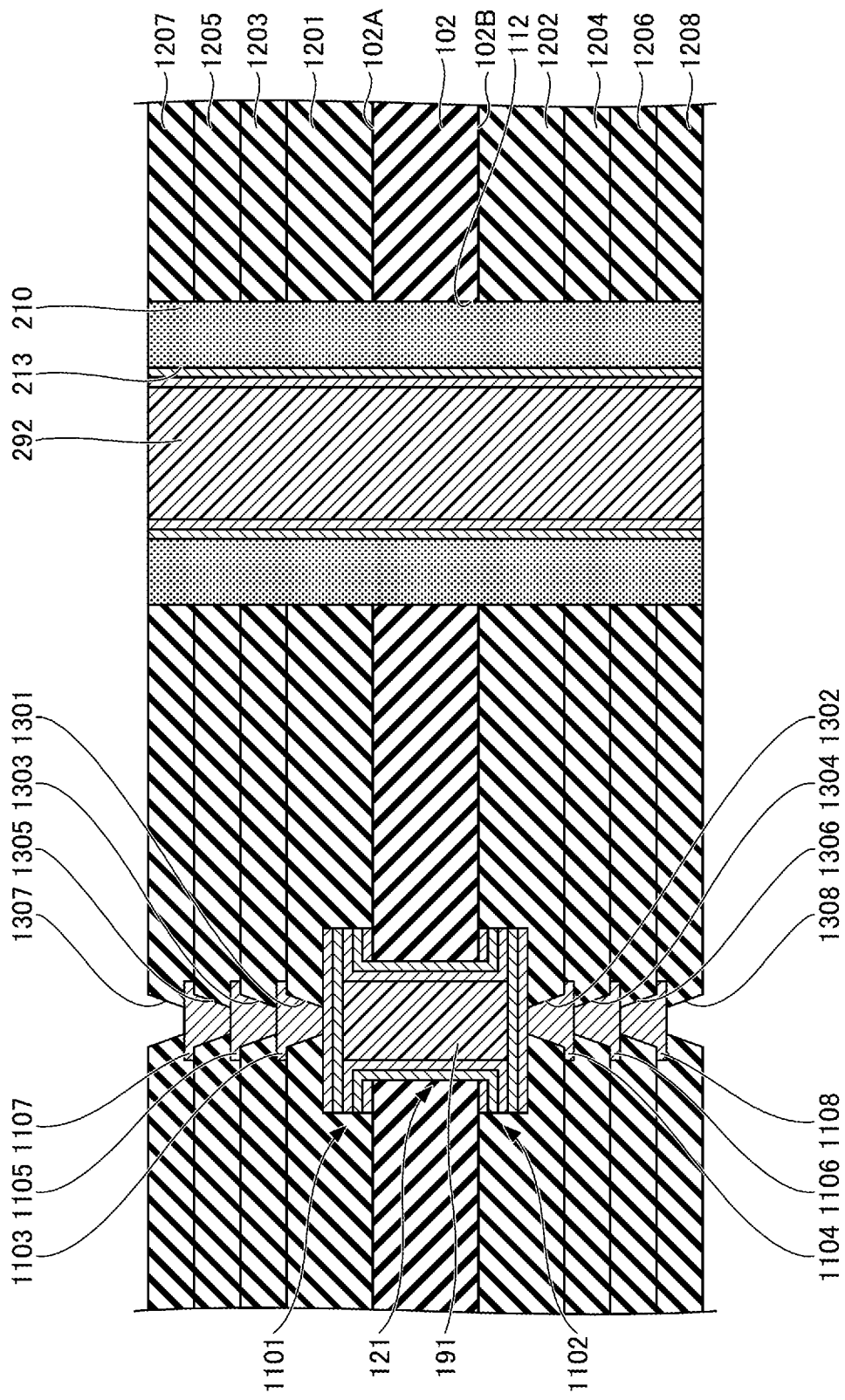
FIG. 28 is a cross sectional view (part 8) illustrating the method for manufacturing the wiring board according to the second embodiment.

Next, as illustrated in FIG. 28, by performing laser beam machining with respect to the seventh insulating layer 1207 and the eighth insulating layer 1208, the via hole 1307, that reaches the connecting portion of the seventh interconnect layer 1107, is formed in the seventh insulating layer 1207, and the via hole 1308, that reaches the connecting portion of the eighth interconnect layer 1108, is formed in the eighth insulating layer 1208.

Figure 29:
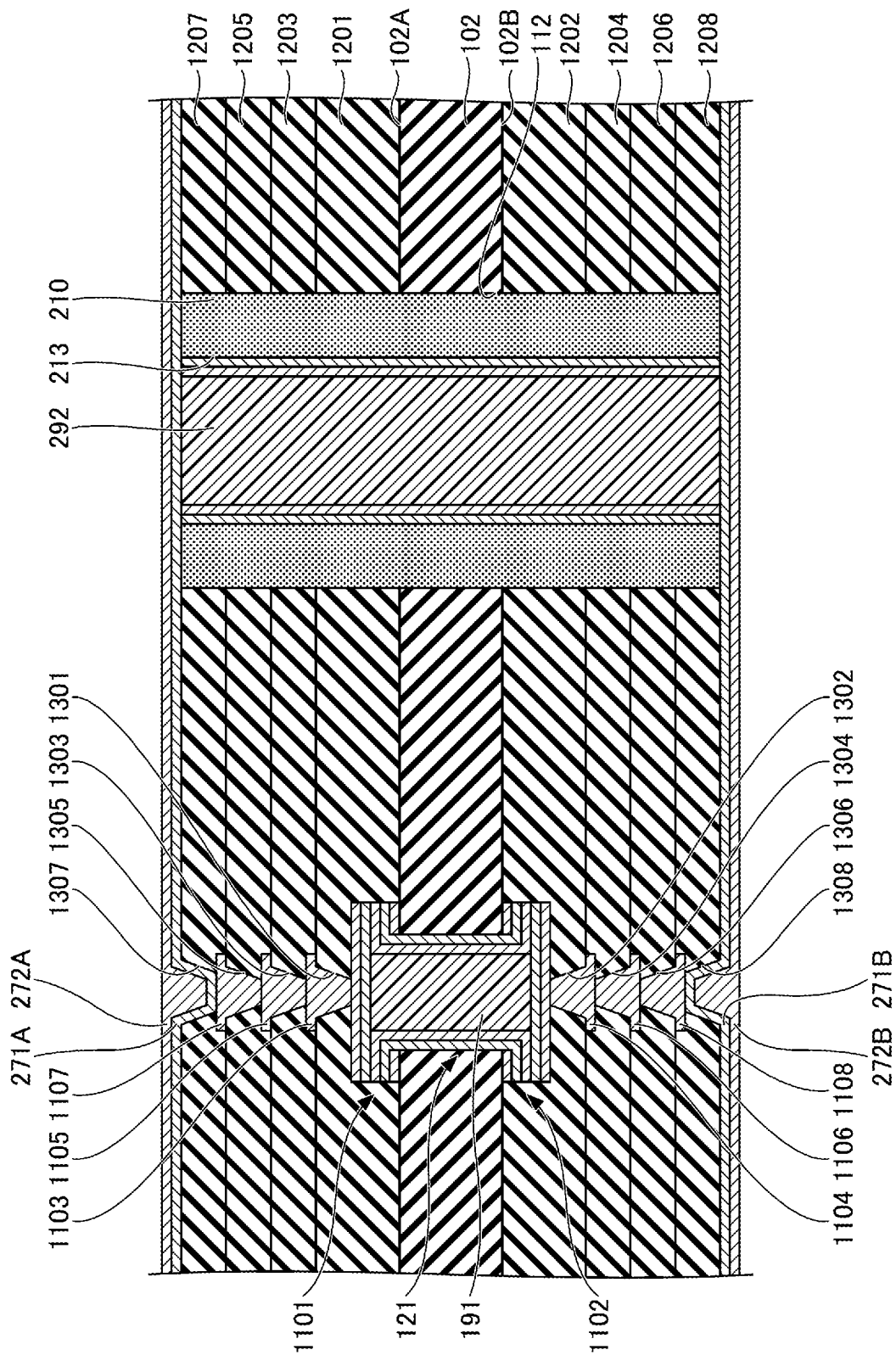
FIG. 29 is a cross sectional view (part 9) illustrating the method for manufacturing the wiring board according to the second embodiment.

Thereafter, as illustrated in FIG. 29, the electroless copper plating film 271A is formed on the surfaces of the magnetic material 210, the electroless copper plating film 273, the electrolytic copper plating film 274, and the second filler material 292 that coincide with the surface of the seventh insulating layer 1207, the surface of the seventh insulating layer 1207, and the inner surface defining the via hole 1307. Similarly, the electroless copper plating film 271B is formed on the surfaces of the magnetic material 210, the electroless copper plating film 273, the electrolytic copper plating film 274, and the second filler material 292 that coincide with the surface of the eighth insulating layer 1208, the surface of the eighth insulating layer 1208, and the inner surface defining the via hole 1308. Next, the electrolytic copper plating film 272A is famed on the electroless copper plating film 271A by electrolytic plating that utilizes the electroless copper plating film 271A as a plating power feeding path, and the electrolytic copper plating film 272B is formed on the electroless copper plating film 271B by electrolytic plating that utilizes the electroless copper plating film 271B as a plating power feeding path. The electroless copper plating films 271A and 271B have a thickness in a range of 0.3 μm to 1.0 μm, for example, and the electrolytic copper plating films 272A and 272B have a thickness in a range of 15 μm to 40 μm, for example. The electrolytic copper plating film 272A fills the inside of the via hole 1307. In addition, the electrolytic copper plating film 272B fills the inside of the via hole 1308.

Figure 30:
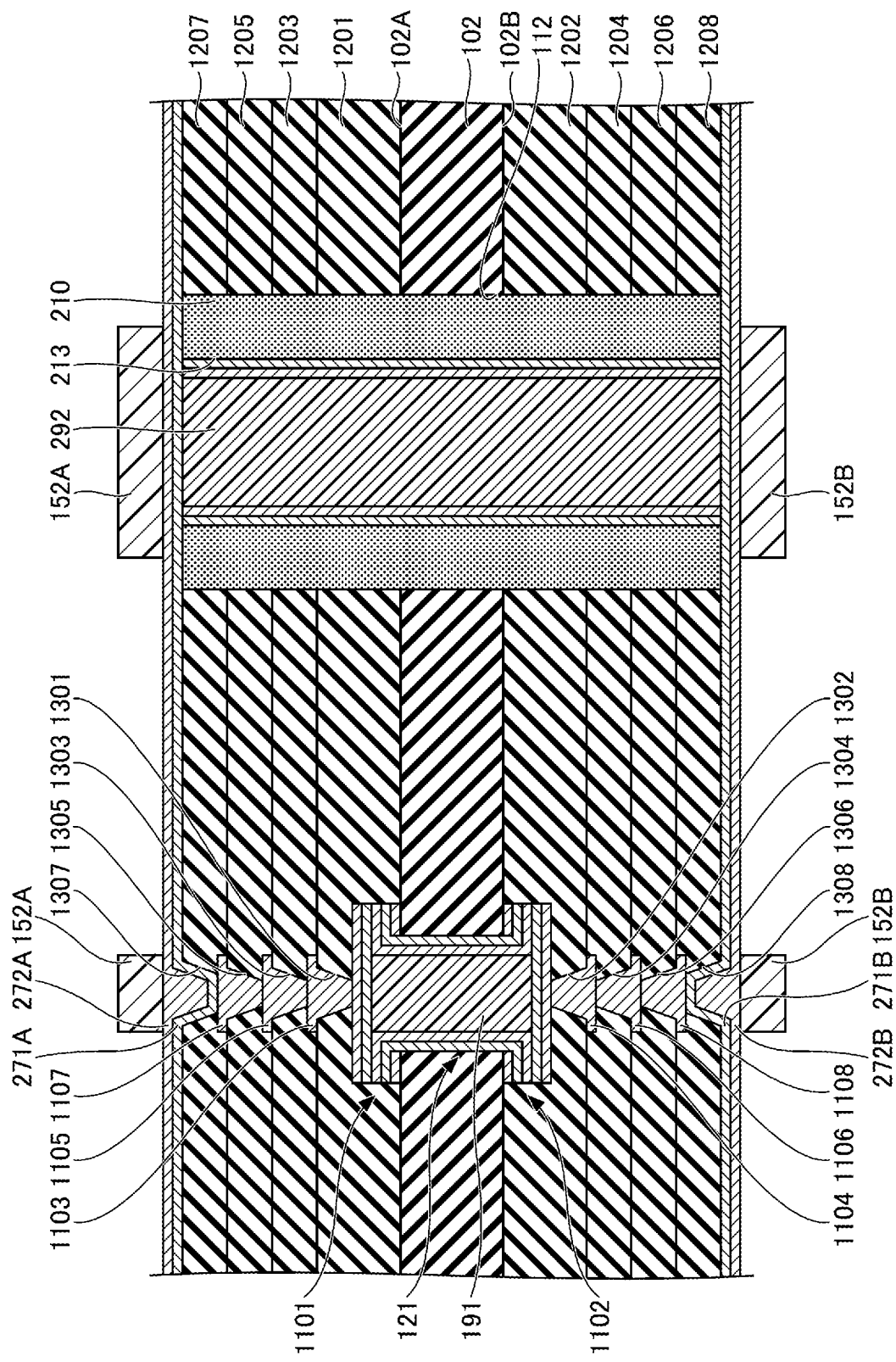
FIG. 30 is a cross sectional view (part 10) illustrating the method for manufacturing the wiring board according to the second embodiment.

Then, as illustrated in FIG. 30, the resist layer 152A having the pattern of the ninth interconnect layer 1109 is formed on the electrolytic copper plating film 272A, and the resist layer 152B having the pattern of the tenth interconnect layer 1110 is formed on the electrolytic copper plating film 272B.

Figure 31:
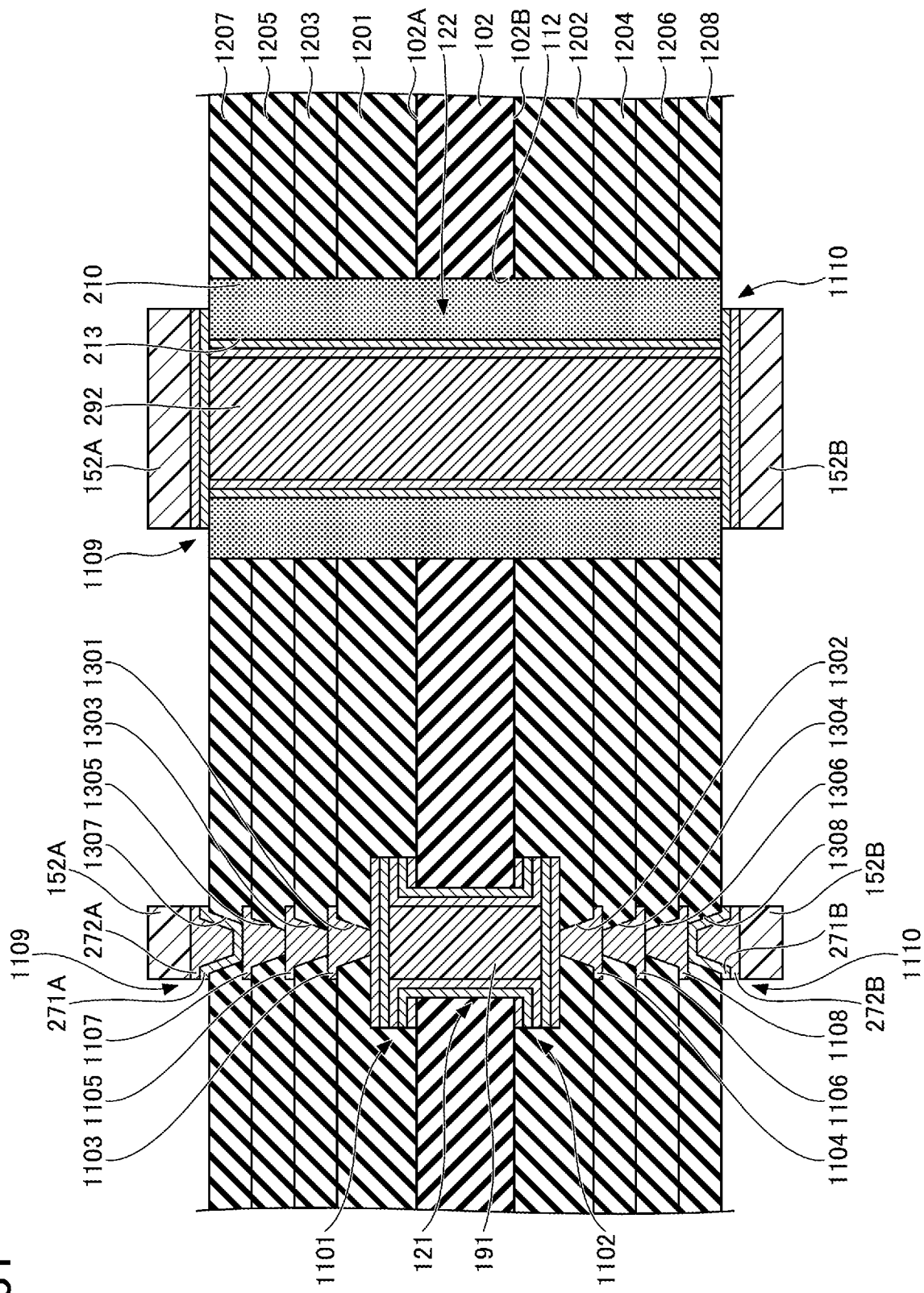
FIG. 31 is a cross sectional view (part 11) illustrating the method for manufacturing the wiring board according to the second embodiment.

Thereafter, as illustrated in FIG. 31, the resist layer 152A is used as a mask to etch the electrolytic copper plating film 272A and the electroless copper plating film 271A. Similarly, the resist layer 152B is used as a mask to etch the electrolytic copper plating film 272B and the electroless copper plating film 271B.

As a result, the second penetrating conductive via 122, the ninth interconnect layer 1109, and the tenth interconnect layer 1110 are obtained. The second penetrating conductive via 122 includes the electroless copper plating film 273 and the electrolytic copper plating film 274. The ninth interconnect layer 1109 includes the electroless copper plating film 271A and the electrolytic copper plating film 272A. The tenth interconnect layer 1110 includes the electroless copper plating film 271B and the electrolytic copper plating film 272B.

Figure 32:
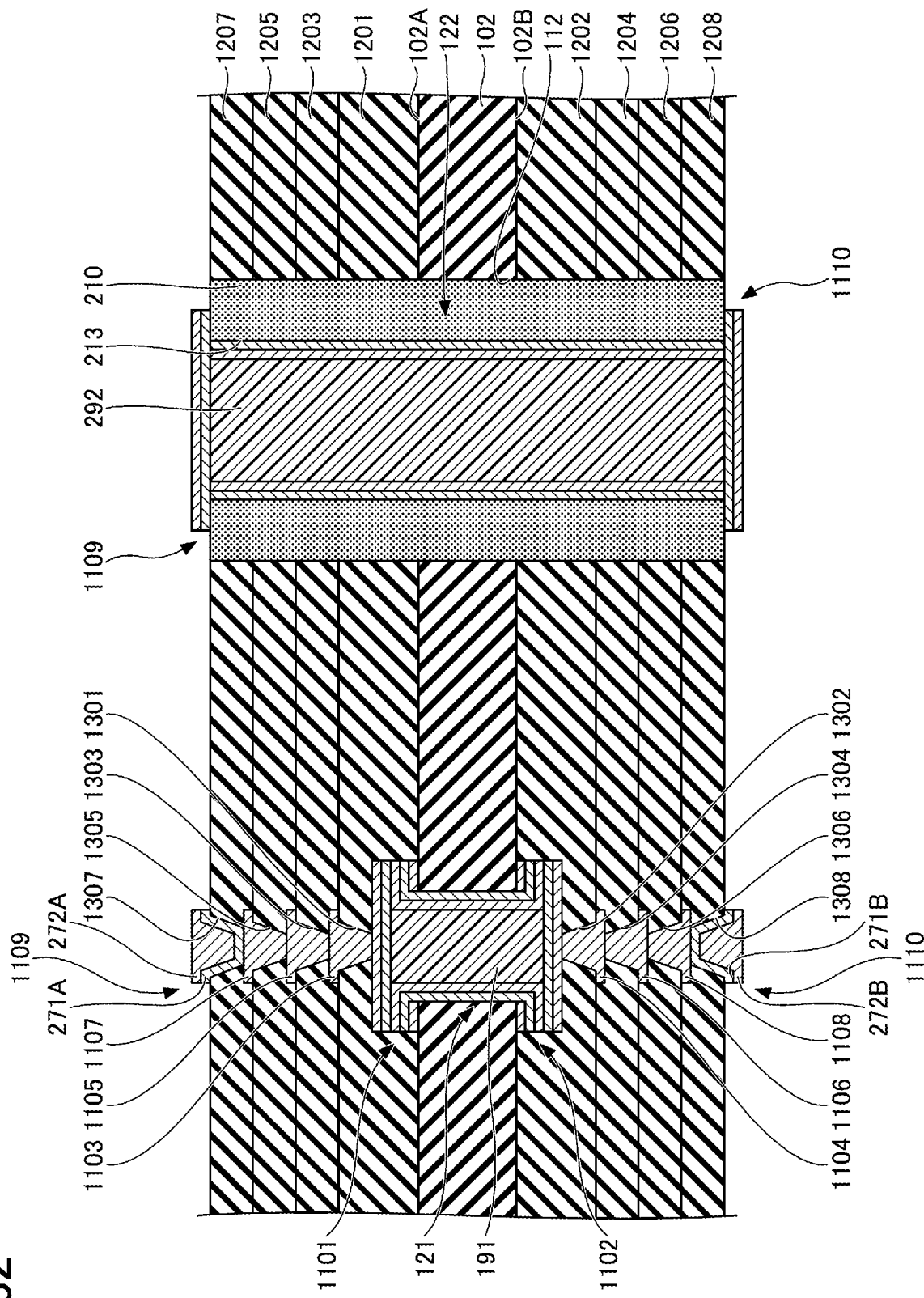
FIG. 32 is a cross sectional view (part 12) illustrating the method for manufacturing the wiring board according to the second embodiment.

Then, as illustrated in FIG. 32, the resist layers 152A and 152B are removed.

Figure 33:
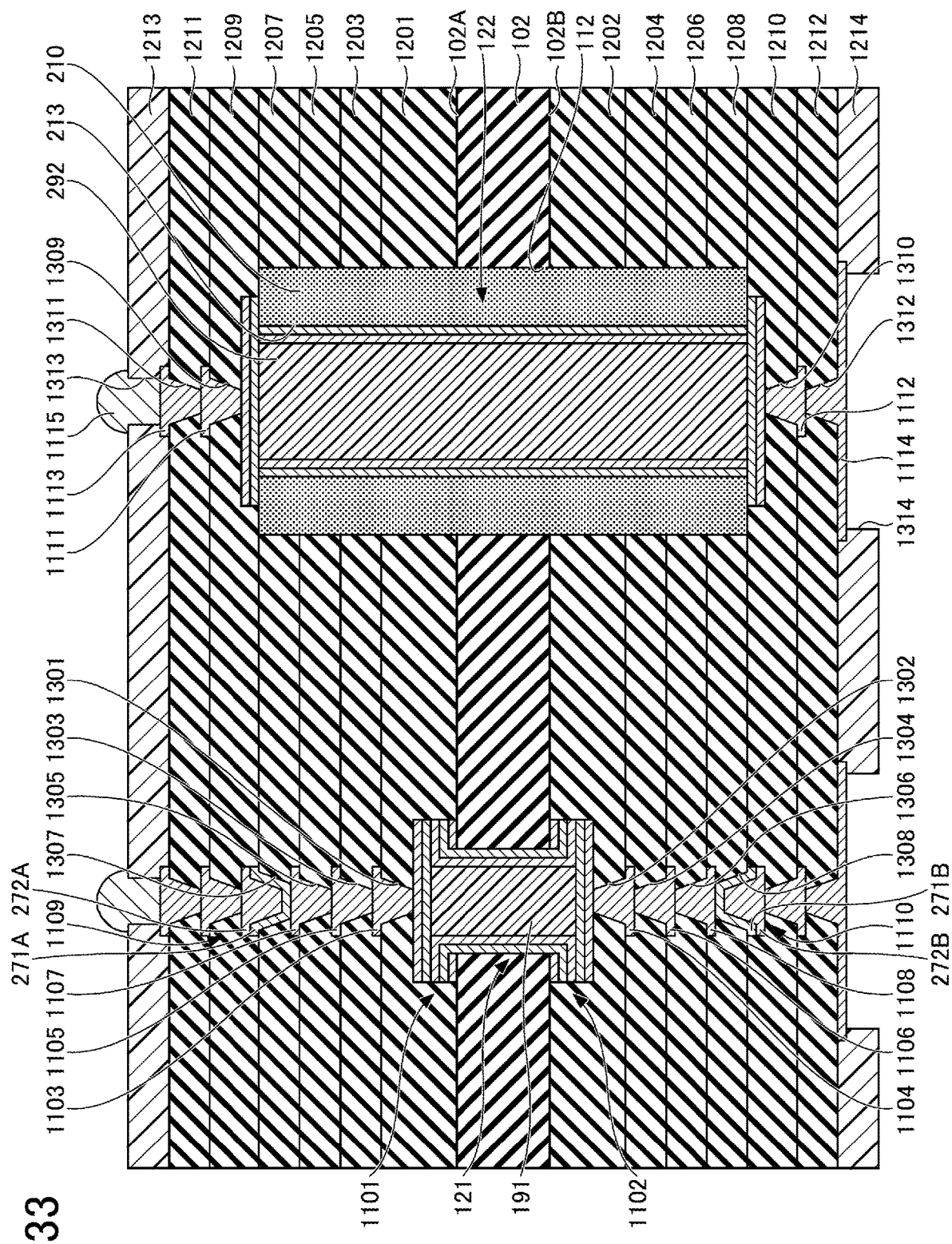
FIG. 33 is a cross sectional view (part 13) illustrating the method for manufacturing the wiring board according to the second embodiment.

Thereafter, as illustrated in FIG. 33, the processes after forming the ninth insulating layer 1209 and the tenth insulating layer 1210 are performed, similar to the first embodiment. Accordingly, it is possible to manufacture the wiring board according to the second embodiment.

The second embodiment can obtain the same effects as the first embodiment described above.

Third Embodiment

Figure 34:
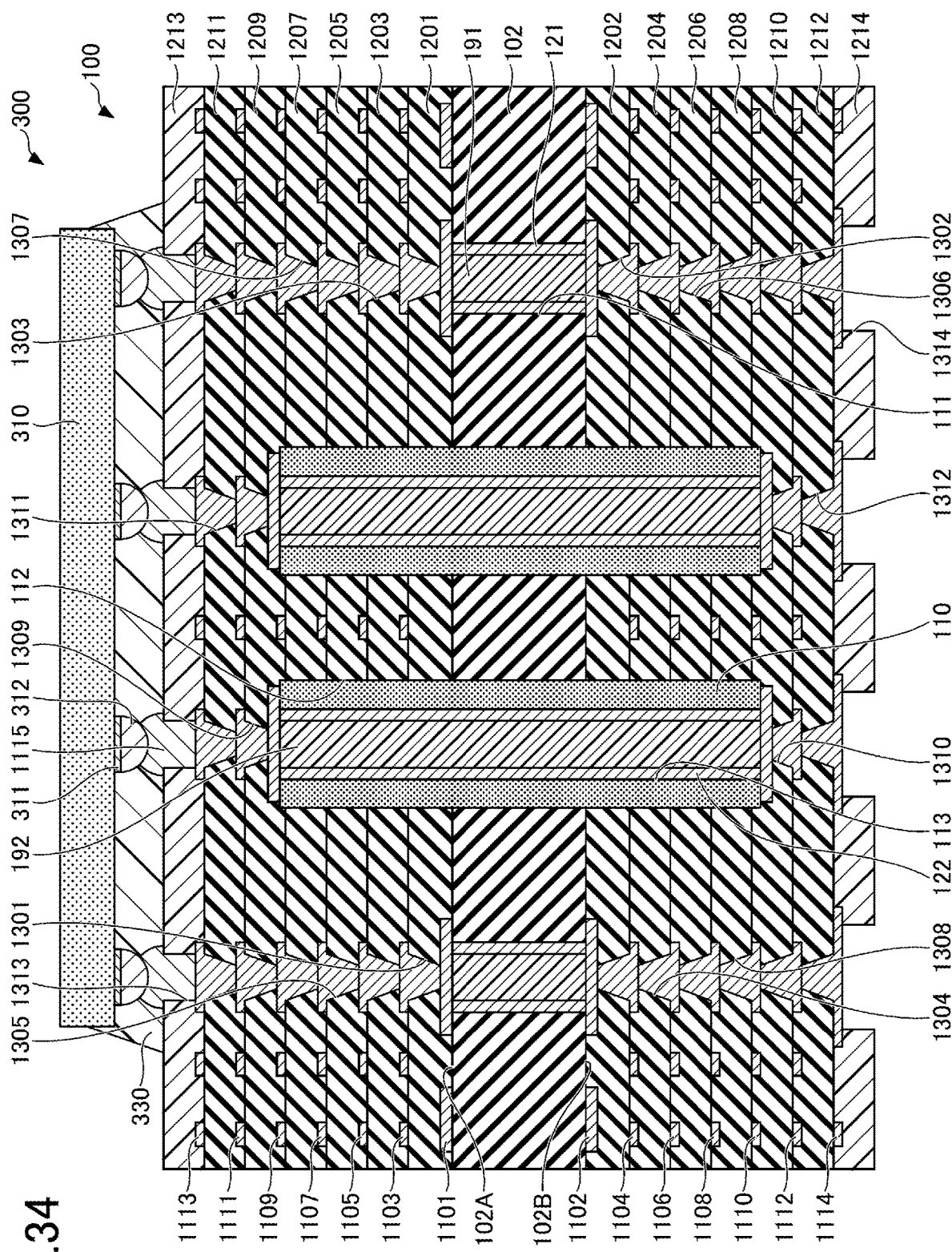
FIG. 34 is a cross sectional view illustrating a semiconductor package according to a third embodiment.

Next, a third embodiment will be described. The third embodiment relates to a semiconductor package. FIG. 34 is a cross sectional view illustrating the semiconductor package according to the third embodiment.

As illustrated in FIG. 34, a semiconductor package 300 according to the third embodiment includes the wiring board 100 according to the first embodiment, a semiconductor chip 310, a bump 312, and an underfill resin 330.

The semiconductor chip 310 includes a connection terminal 311 electrically connected to the connection terminal 1115 through the bump 312. The connection terminal 311 is an electrode pad, for example. For example, a solder bump may be used for the bump 312. Examples of solder bump materials include lead (Pb)-free solders, such as tin silver (SnAg) based alloys, tin zinc (SnZn) based alloys, and tin copper (SnCu) based alloys, and lead (Pb)-containing solders including lead tin (PbSn) based alloys. An underfill resin 330 made of an epoxy resin or the like, is filled between the semiconductor chip 310 and the solder resist layer 1213 of the wiring board 100.

When manufacturing the semiconductor package 300, the singulated wiring board 100 is prepared, and the bump 312 is used to mount the semiconductor chip 310 onto the wiring board 100 by flip-chip bonding. After mounting the semiconductor chip 310, the underfill resin 330 is filled between the semiconductor chip 310 and the solder resist layer 1213.

It is possible to manufacture the semiconductor package 300 in the manner described above.

The wiring board according to the second embodiment may be used in place of the wiring board 100 according to the first embodiment.

In the present disclosure, the material used for the first conductive layer and the second conductive layer is not limited to copper, and the first conductive layer and the second conductive layer may include a plating film of other metals, such as nickel or the like.

Accordingly to each of the embodiments described above, it is possible to provide a wiring board and a method for manufacturing the wiring board, which can increase the inductance while reducing the deterioration of the production efficiency.

Various aspects of the subject matter described herein may be set out non-exhaustively in the following numbered clauses:

1. A method for manufacturing a wiring board, comprising:
   forming a first through hole in an insulating base having a first principal surface, and a second principal surface opposite to the first principal surface;

providing a first conductive layer inside the first through hole;

forming a first insulating layer covering the first principal surface;

forming a second insulating layer covering the second principal surface;

forming a second through hole in the first insulating layer, the base, and the second insulating layer;

filling a magnetic material inside the second through hole;

forming a third through hole in the magnetic material; and providing the second conductive layer inside the third through hole.

2. The method for manufacturing the wiring board according to clause 1, further comprising:

forming a first interconnect layer, electrically connected to the first conductive layer, on the first principal surface;

forming a second interconnect layer, electrically connected to the first conductive layer, on the second principal surface;

forming a third interconnect layer, electrically connected to the second conductive layer, on the first insulating layer; and forming a fourth interconnect layer, electrically connected to the second conductive layer, on the second insulating layer.

3. The method for manufacturing the wiring board according to clause 1 or 2, wherein the first conductive layer is provided on a wall defining the first through hole, and the second conductive layer is provided on a wall defining the third through hole.

4. The method for manufacturing the wiring board according to clause 3, further comprising:

filling an inner portion of the first conductive layer inside the first through hole with an insulating first filler material; and filling an inner portion of the second conductive layer inside the third through hole with an insulating second filler material.

5. The method for manufacturing the wiring board according to any one of clauses 1 to 4, wherein the first insulating layer is famed by laminating a plurality of insulating layers, and the second insulating layer is formed by laminating a plurality of insulating layers.

Although the embodiments are numbered with, for example, "first," "second," or "third," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:

an insulating base having a first principal surface, and a second principal surface opposite to the first principal surface;

a first through hole formed in the base;

a first conductive layer provided inside the first through hole, and having an upper end surface exposed at the first principal surface and a lower end surface exposed at the second principal surface;

a first insulating layer covering the first principal surface, and having a lower surface in contact with the first principal surface and an upper surface opposite to the lower surface thereof;

a second insulating layer covering the second principal surface, and having an upper surface in contact with the second principal surface and a lower surface opposite to the upper surface thereof;

a second through hole formed in the first insulating layer, the base, and the second insulating layer;

a magnetic material provided inside the second through hole, and having an upper end surface exposed at the upper surface of the first insulating layer and a lower end surface exposed at the lower surface of the second insulating layer;

a third through hole formed in the magnetic material; and a second conductive layer provided inside the third through hole, and having an upper end surface exposed at the upper surface of the first insulating layer and a lower end surface exposed at the lower surface of the second insulating layer, wherein the first through hole and the second through hole have mutually different depths in a thickness direction of the wiring board.

2. The wiring board as claimed in claim 1, further comprising:

a first interconnect layer formed on the first principal surface and electrically connected to the first conductive layer;

a second interconnect layer formed on the second principal surface and electrically connected to the first conductive layer;

a third interconnect layer formed on the first insulating layer and electrically connected to the second conductive layer; and a fourth interconnect layer formed on the second insulating layer and electrically connected to the second conductive layer.

3. The wiring board as claimed in claim 2, wherein the first conductive layer is provided on a wall defining the first through hole, and the second conductive layer is provided on a wall defining the third through hole.

4. The wiring board as claimed in claim 2, wherein the first interconnect layer contacts the first principal surface and the upper end surface of the first conductive layer, the second interconnect layer contacts the second principal surface and the lower end surface of the first conductive layer, the third interconnect layer contacts the upper end surface of the magnetic material, the upper end surface of the second conductive layer, and the upper surface of the first insulating layer, and the fourth interconnect layer contacts the lower end surface of the magnetic material, the lower end surface of the second conductive layer, and the lower surface of the second insulating layer.

5. The wiring board as claimed in claim 4, wherein
the first insulating layer includes a first laminated structure configured to cover the first principal surface and the first interconnect layer, and a second laminated structure provided on the first laminated structure and configured to cover the third interconnect layer, and
the second insulating layer includes a third laminated structure configured to cover the second principal surface and the second interconnect layer, and a fourth laminated structure provided on the third laminated structure and configured to cover the fourth interconnect layer.

6. The wiring board as claimed in claim 1, wherein
the first conductive layer is provided on a wall defining the first through hole, and
the second conductive layer is provided on a wall defining the third through hole.

7. The wiring board as claimed in claim 6, further comprising:
an insulating first filler material that fills an inner portion of the first conductive layer inside the first through hole; and
an insulating second filler material that fills an inner portion of the second conductive layer inside the third through hole.

8. The wiring board as claimed in claim 7, wherein
the upper end surface of the magnetic material, the upper end surface of the second conductive layer, and an upper end surface of the insulating second filler material protrude from the upper surface of the first insulating layer, and
the lower end surface of the magnetic material, the lower end surface of the second conductive layer, and a lower end surface of the insulating second filler material protrude from the lower surface of the second insulating layer.

9. The wiring board as claimed in claim 7, wherein
the upper end surface of the magnetic material, the upper end surface of the second conductive layer, and an upper end surface of the insulating second filler material coincide with the upper surface of the first insulating layer, and
the lower end surface of the magnetic material, the lower end surface of the second conductive layer, and a lower end surface of the insulating second filler material coincide with the lower surface of the second insulating layer.

10. The wiring board as claimed in claim 1, wherein
the first insulating layer includes a laminate of a plurality of insulating layers, and
the second insulating layer includes a laminate of a plurality of insulating layers.

11. The wiring board as claimed in claim 1, wherein
the upper end surface of the magnetic material and the upper end surface of the second conductive layer protrude from the upper surface of the first insulating layer, and
the lower end surface of the magnetic material and the lower end surface of the second conductive layer protrude from the lower surface of the second insulating layer.

12. The wiring board as claimed in claim 1, wherein
the upper end surface of the magnetic material and the upper end surface of the second conductive layer coincide with the upper surface of the first insulating layer, and
the lower end surface of the magnetic material and the lower end surface of the second conductive layer coincide with the lower surface of the second insulating layer.

13. A semiconductor package comprising:
the wiring board according to claim 1;
a plurality of connection terminals disposed on the wiring board above the first insulating layer, and electrically connected to the first conductive layer and the second conductive layer;
a plurality of bumps in contact with the plurality of connection tell finals, respectively;
a semiconductor chip disposed on the wiring board above the first insulating layer, and electrically connected to the plurality of connection terminals via the plurality of bumps, respectively; and
an underfill resin filled between the wiring board and the semiconductor chip, and configured to cover exposed portions of both the plurality of connection terminals and the plurality of bumps.

* * * * *